(12) United States Patent
Homma et al.

(10) Patent No.: US 9,048,200 B2
(45) Date of Patent: Jun. 2, 2015

(54) SEMICONDUCTOR INTEGRATED CIRCUIT DEVICE AND METHOD OF MANUFACTURING SAME

(75) Inventors: Takuro Homma, Tokyo (JP); Katsuhiko Hotta, Tokyo (JP); Takashi Moriyama, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 265 days.

(21) Appl. No.: 13/610,850

(22) Filed: Sep. 11, 2012

(65) Prior Publication Data

US 2013/0065330 A1    Mar. 14, 2013

Related U.S. Application Data

(62) Division of application No. 12/761,350, filed on Apr. 15, 2010, now Pat. No. 8,373,270.

(30) Foreign Application Priority Data

Apr. 16, 2009  (JP) ................................. 2009-099689

(51) Int. Cl.
*H01L 23/48* (2006.01)
*H01L 23/31* (2006.01)
(Continued)

(52) U.S. Cl.
CPC ............ *H01L 23/3192* (2013.01); *H01L 22/32* (2013.01); *H01L 24/03* (2013.01); *H01L 24/06* (2013.01); *H01L 24/45* (2013.01);
(Continued)

(58) Field of Classification Search
CPC ...................................................... H01L 24/15

USPC ............................................................. 438/40
See application file for complete search history.

(56) References Cited

U.S. PATENT DOCUMENTS 5,329,068 A * 7/1994 Hirata et al. .................. 174/261
6,143,396 A   11/2000 Saran et al.
(Continued)

FOREIGN PATENT DOCUMENTS

JP    02-205323 A    8/1990
JP   2001-351920 A   12/2001
(Continued)

OTHER PUBLICATIONS

Office Action dated Oct. 10, 2013, in Japanese Patent Application No. 2009-099689.
(Continued)

*Primary Examiner* — Thomas L Dickey
(74) *Attorney, Agent, or Firm* — Miles & Stockbridge P.C.

(57) ABSTRACT

In manufacturing an LSI, or semiconductor integrated circuit device, the step of assembling device (such as resin sealing step) is normally followed by a voltage-application test in an environment of high temperature (e.g., from 85 to 130° C.) and high humidity (e.g., about 80% RH). It has been found that separation of a titanium nitride anti-reflection film from an upper film and generation of cracks in the titanium nitride film at an upper surface edge part of the aluminum-based bonding pad applied with a positive voltage in the test is caused by an electrochemical reaction due to moisture incoming through the sealing resin and the like to generate oxidation and bulging of the titanium nitride film. These problems are addressed by removing the titanium nitride film over the pad in a ring or slit shape at peripheral area of the aluminum-based bonding pad.

18 Claims, 30 Drawing Sheets

(51) Int. Cl.
*H01L 21/66* (2006.01)
*H01L 23/00* (2006.01)

(52) U.S. Cl.
CPC .......... *H01L2224/0401* (2013.01); *H01L 2224/04042* (2013.01); *H01L 2224/05552* (2013.01); *H01L 2224/05567* (2013.01); *H01L 2224/05571* (2013.01); *H01L 2224/05624* (2013.01); *H01L 2224/45144* (2013.01); *H01L 2224/48091* (2013.01); *H01L 2224/48227* (2013.01); *H01L 2224/48228* (2013.01); *H01L 2924/01004* (2013.01); *H01L 2924/01005* (2013.01); *H01L 2924/01007* (2013.01); *H01L 2924/01013* (2013.01); *H01L 2924/01014* (2013.01); *H01L 2924/01015* (2013.01); *H01L 2924/01018* (2013.01); *H01L 2924/01022* (2013.01); *H01L 2924/01025* (2013.01); *H01L 2924/01027* (2013.01); *H01L 2924/01029* (2013.01); *H01L 2924/01033* (2013.01); *H01L 2924/01047* (2013.01); *H01L 2924/01051* (2013.01); *H01L 2924/01074* (2013.01); *H01L 2924/01079* (2013.01); *H01L 2924/01082* (2013.01); *H01L 2924/014* (2013.01); *H01L 2924/04941* (2013.01); *H01L 2924/05042* (2013.01); *H01L 2924/10253* (2013.01); *H01L 2924/13091* (2013.01); *H01L 2924/14* (2013.01); *H01L 2924/15311* (2013.01); *H01L 2924/19041* (2013.01); *H01L 2924/19043* (2013.01); *H01L 24/48* (2013.01); *H01L 2924/01006* (2013.01); *H01L 2924/01019* (2013.01); *H01L 2924/01045* (2013.01); *H01L 2224/73265* (2013.01); *H01L 2224/32225* (2013.01); *H01L 2224/48624* (2013.01); *H01L 2224/05553* (2013.01)

(56) References Cited

U.S. PATENT DOCUMENTS

| | | | |
|---|---|---|---|
| 6,339,257 | B1 | 1/2002 | Fujiki et al. |
| 6,417,575 | B2 | 7/2002 | Harada et al. |
| 6,625,882 | B1 | 9/2003 | Saran et al. |
| 7,646,097 | B2 | 1/2010 | Yu et al. |
| 7,880,256 | B2 | 2/2011 | Takai et al. |
| 7,947,978 | B2 | 5/2011 | Lin et al. |
| 2002/0005583 | A1 | 1/2002 | Harada et al. |
| 2002/0011669 | A1 | 1/2002 | Fujiki et al. |
| 2006/0249845 | A1* | 11/2006 | Takai et al. .............. 257/750 |
| 2007/0164279 | A1 | 7/2007 | Lin et al. |
| 2007/0182001 | A1 | 8/2007 | Kanzaki et al. |
| 2007/0184578 | A1* | 8/2007 | Lin et al. ................. 438/106 |
| 2008/0088023 | A1 | 4/2008 | Oda |
| 2008/0290516 | A1 | 11/2008 | Oda |
| 2010/0155960 | A1 | 6/2010 | Kanzaki et al. |
| 2010/0181650 | A1 | 7/2010 | Shigihara et al. |
| 2010/0184285 | A1 | 7/2010 | Hua et al. |
| 2011/0209899 | A1 | 9/2011 | Hill |

FOREIGN PATENT DOCUMENTS

| | | | |
|---|---|---|---|
| JP | 2006-303452 A | | 11/2006 |
| JP | 2007-103593 A | | 4/2007 |
| JP | 2007103593 A | * | 4/2007 |
| JP | 2007-169493 A | | 7/2007 |

OTHER PUBLICATIONS

Office Action dated Nov. 19, 2013, in Chinese Patent Application No. 201010162093.X.

Office Action issued Feb. 25, 2015, in Taiwanese Patent Application No. 099108512.

* cited by examiner

SEMICONDUCTOR INTEGRATED CIRCUIT DEVICE AND METHOD OF MANUFACTURING SAME

CROSS-REFERENCE TO RELATED APPLICATIONS

This application is a division of application Ser. No. 12/761,350 filed Apr. 15, 2010 now U.S. Pat. No. 8,373,270. Also, the disclosure of Japanese Patent Application No. 2009-99689 filed Apr. 16, 2009 including the specification, drawings and abstract is incorporated herein by reference in its entirety.

BACKGROUND OF THE INVENTION

The present invention relates to a semiconductor integrated circuit device (hereinafter referred to also as semiconductor device) and a method of manufacturing same, specifically to a technology effective in applying thereof to a technology relating to peripheral area of pad electrode such as that of aluminum-based bonding pad.

Japanese Patent Laid-Open No. 2006-303452 (Patent Document 1) or USP-2006-0249845 (Patent Document 2) discloses a technology of covering an aluminum-based bonding pad with a silicon nitride film or the like over entire surface thereof including side faces of anti-reflection film such as titanium nitride film at edge part of peripheral area of upper surface thereof in order to prevent elution of the aluminum-based pad caused by cell reaction due to external moisture and the like at the pad portion.

Japanese Patent Laid-Open No. 2007-103593 (Patent Document 3) discloses a technology of covering an aluminum-based bonding pad with a silicon nitride film or the like over entire surface thereof including side faces of anti-reflection film such as titanium nitride film at edge part of peripheral area of upper surface thereof in order to prevent elution of the aluminum-based pad caused by local cell effect due to moisture and the like at the pad portion.

SUMMARY OF THE INVENTION

In the current manufacturing process of LSI, or semiconductor integrated circuit device, the step of assembling device (such as resin sealing step) is normally followed by the voltage-application test (high-temperature and high-humidity test) in an environment of high temperature (such as an approximate range from 85 to 130° C.) and high humidity (such as about 80% RH). For that test, the inventors of the present invention found the phenomenon of occurrence of separation of titanium nitride film as the anti-reflection film from upper film and of generation of cracks in the titanium nitride film at an edge part of upper surface of the aluminum-based bonding pad applied with a positive voltage during the high-temperature and high-humidity test caused by an electrochemical reaction due to moisture incoming through the sealing resin and the like to generate oxidation and bulging of the titanium nitride film.

The present invention has been perfected to solve these problems.

The present invention has been made in view of the above circumstances and provides a process for manufacturing a highly reliable semiconductor integrated circuit device.

The other purposes and the new feature of the present invention will become clear from the description of the present specification and the accompanying drawings.

The following explains briefly the outline of a typical invention among the inventions disclosed in the present application.

An invention of the present application is to remove the titanium nitride film over the pad in a ring or slit shape at peripheral area of the aluminum-based bonding pad.

The following explains briefly the effect acquired by the typical invention among the inventions disclosed in the present application.

At peripheral area of the aluminum-based bonding pad, the titanium nitride film over the pad is removed in a ring or slit shape, thus preventing the propagation of influence of the oxidation of titanium to outside the pad.

DETAILED DESCRIPTION OF PREFERRED EMBODIMENTS

Outline of the Embodiments

Figure 1:
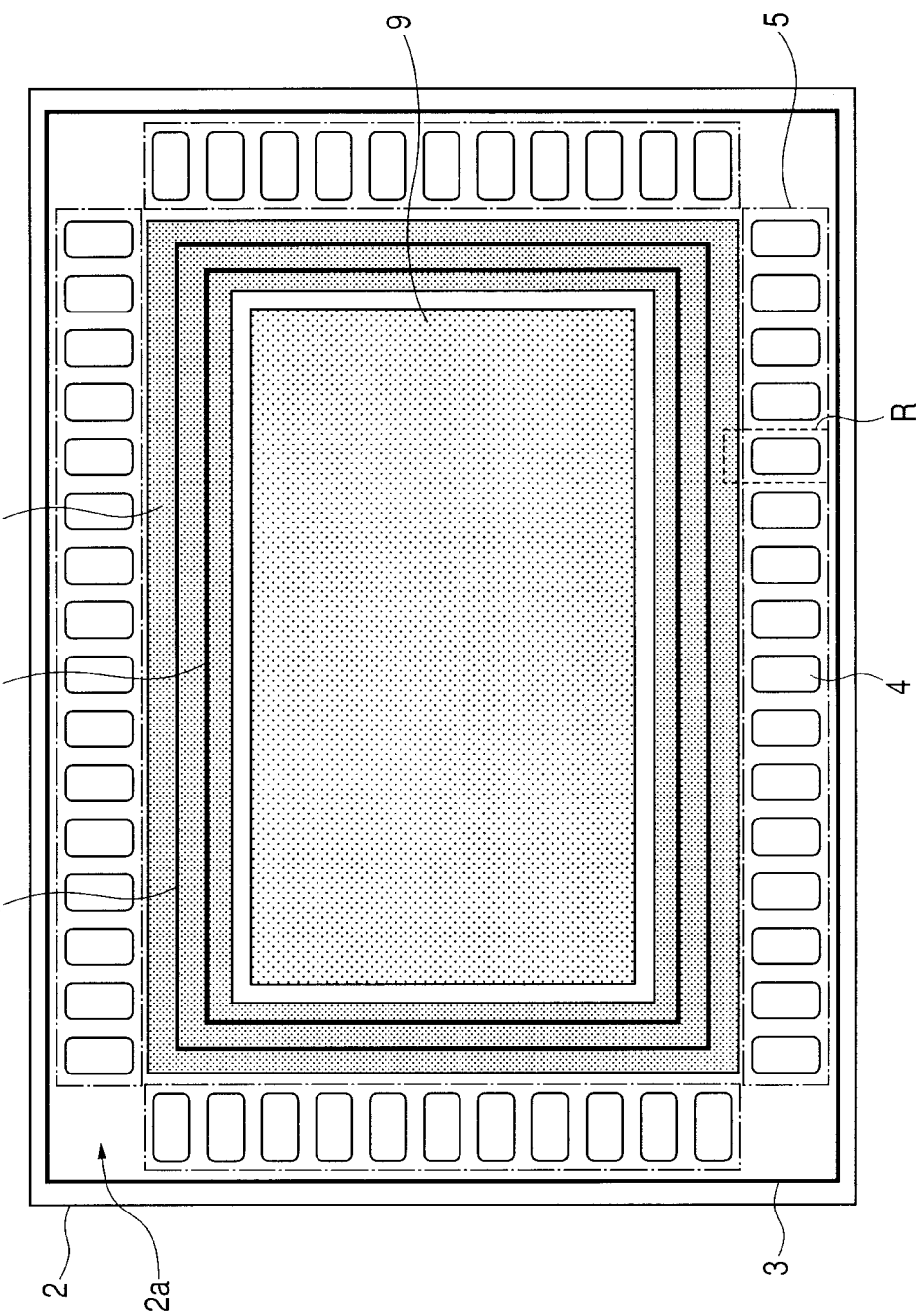
FIG. 1 is a schematic plan view illustrating a layout inside a chip of semiconductor integrated circuit device, (first main surface), of Embodiment 1, (same is applied to Embodiments 2 to 5)

Outline of the typical inventions disclosed in the present application will be described below.

1. A semiconductor integrated circuit device comprising: (a) a semiconductor chip having a first and a second main surface; (b) an aluminum-based metal film pattern provided over the first main surface of the semiconductor chip; (c) a titanium nitride film covering an upper surface of the aluminum-based metal film pattern; (d) an insulation surface protective film covering the first main surface of the semiconductor chip including an upper surface of the titanium nitride film; (e) a bonding pad opening formed in the insulation surface protective film; (f) a first opening part corresponding to the bonding pad opening formed in the titanium nitride film; and (g) a second opening part formed in the titanium nitride film in the vicinity of the first opening part.

2. The semiconductor integrated circuit device according to above 1, wherein the second opening part of the aluminum-based metal film pattern is covered with the insulation surface protective film.

3. The semiconductor integrated circuit device according to above 2, wherein the insulation surface protective film is a laminated film containing a silicon oxide-based film as a lower layer and a silicon nitride-based film as an upper layer.

4. The semiconductor integrated circuit device according to above 1 or 3, wherein the titanium nitride film is covered with the insulation surface protective film, and the second opening part is not covered with the insulation surface protective film.

5. The semiconductor integrated circuit device according to any one of above 1 to 4, wherein a passivation film is formed over the surface of the aluminum-based metal film pattern of the second opening part.

6. The semiconductor integrated circuit device according to any one of above 1 to 5, wherein the width of the second opening part is in a range from 0.3 to 10 micrometer.

7. The semiconductor integrated circuit device according to any one of above 1 to 6, wherein the width of the first opening part is larger than that of the second opening part.

8. The semiconductor integrated circuit device according to any one of above 1 to 7, wherein the second opening part is formed in a ring shape so as to surround the first opening part.

9. The semiconductor integrated circuit device according to any one of above 1 to 8, wherein the first opening part has a wire bonding region and a wafer test probe contact region.

10. The semiconductor integrated circuit device according to any one of above 1 to 9, wherein, in a needle-trace portion in the wafer test probe contact region, a passivation film on the surface of the aluminum-based metal film pattern is removed.

11. The semiconductor integrated circuit device according to any one of above 1 to 9, wherein the aluminum-based metal film pattern has a bonding pad part containing the first opening part therein and a wiring part coupled thereto, and the second opening part is formed in the vicinity of a boundary between the bonding pad part and the wiring part.

12. The semiconductor integrated circuit device according to any one of above 1 to 11, further comprising: (h) the first main surface of the semiconductor chip, the aluminum-based metal film pattern, the titanium nitride film, the first opening part, and the second opening part, all of which being sealed with a halogen-free resin.

Furthermore, outline of other inventions disclosed in the present application will be described below.

13. A method of manufacturing a semiconductor integrated circuit device comprising the steps of: (a) forming a metal composite film pattern by patterning a metal composite film containing a lower layer barrier metal film, a middle layer aluminum-based metal film, and an upper layer barrier metal film, which are formed over a multilayer wiring layer over a device surface of a semiconductor wafer; (b) forming an insulation surface protective film over almost entire surface of the device surface of the semiconductor wafer including the upper surface of the metal composite film pattern; (c) after the step (b) and before the step (d), forming a bonding pad opening in the insulation surface protective film; (d) forming a first opening part at a portion corresponding to the bonding pad opening of the upper layer barrier metal film; and (e) forming a second opening part in the upper layer barrier metal film in the vicinity of the first opening part.

14. The method of manufacturing a semiconductor integrated circuit device according to above 13, wherein the step (e) is executed before the steps (b) and (d).

15. The method of manufacturing semiconductor integrated circuit device according to above 13, wherein the steps (d) and (e) are executed at nearly the same time after the steps (b) and (c).

16. The method of manufacturing a semiconductor integrated circuit device according to above 13, wherein the insulation surface protective film is a laminated film containing a silicon oxide-based film as a lower layer and a silicon nitride-based film as an upper layer.

17. The method of manufacturing a semiconductor integrated circuit device according to above 15, wherein the steps (d) and (e) are executed by continuous processing of the insulation surface protective film and the upper layer barrier metal film using the same etching mask.

18. The method of manufacturing a semiconductor integrated circuit device according to any one of above 13 to 17, wherein the width of the second opening part is in a range from 0.3 to 10 micrometer.

19. The method of manufacturing a semiconductor integrated circuit device according to any one of above 13 to 18, wherein the width of the first opening part is larger than that of the second opening part.

20. The method of manufacturing a semiconductor integrated circuit device according to any one of above 13 to 19, wherein the second opening part is formed in a ring shape so as to surround the first opening part.

21. The method of manufacturing a semiconductor integrated circuit device according to any one of above 13 to 20, wherein the metal composite film pattern has a bonding pad part containing the first opening part therein and a wiring part coupled thereto, and the second opening part is formed in the vicinity of a boundary between the bonding pad part and the wiring part.

22. The method of manufacturing a semiconductor integrated circuit device according to any one of above 13 to 21, further comprising the step of (f) after the steps (a), (d) and (e), applying a passivation treatment to an exposed surface portion of the middle layer aluminum-based metal film.

23. The method of manufacturing a semiconductor integrated circuit device according to any one of above 13 to 22, further comprising the step of (g) after the steps (a) to (e), executing wafer probe inspection by letting a probe needle contact with the surface of the middle layer aluminum-based metal film at the first opening part, and breaking a passivation film over the surface thereof to establish contact.

24. The method of manufacturing a semiconductor integrated circuit device according to above 23, further comprising the step of (h) after the step (g), sealing the upper surface of the metal composite film with a halogen-free resin.

Furthermore, outline of other inventions disclosed in the present application will be described below.

25. A semiconductor integrated circuit device comprising: (a) a semiconductor chip having a first and a second main surface; (b) a plurality of aluminum-based bonding pads provided over the first main surface of the semiconductor chip; (c) an insulation surface protective film covering the first main surface and a peripheral area of each of the bonding pads; and (d) a first opening in the insulation surface protective film formed over each of the bonding pads, wherein each of the bonding pads has no titanium nitride film thereon.

26. The semiconductor integrated circuit device according to above 25, wherein the bonding pads are arranged in a row in a first direction along an edge part of the chip.

27. The semiconductor integrated circuit device according to above 25 or 26, wherein each of the bonding pads is integrally coupled to an aluminum-based wiring in the same layer, and a titanium nitride film is formed over the wiring.

28. The semiconductor integrated circuit device according to any one of above 25 to 27, wherein the insulation surface protective film covers an upper surface and side faces of the titanium nitride film.

29. The semiconductor integrated circuit device according to any one of above 25 to 28, wherein each of the bonding pads has a nearly rectangular shape, and has a bonding region to which the bonding wire is coupled and a contact region to which a probe needle contacts.

30. The semiconductor integrated circuit device according to any one of above 25 to 29, wherein an exposed part of each bonding pad is covered with an aluminum oxide-based passivation film except for a part of the contact region.

31. The semiconductor integrated circuit device according to any one of above 25 to 30, further comprising (e) a halogen-free sealing resin member covering the first main surface of the semiconductor chip, the bonding pads, and the insulation surface protective film.

32. The semiconductor integrated circuit device according to any one of above 26 to 31, wherein the titanium nitride film is absent in the vicinity of each bonding pad of the wiring and is present in the other portions, in a second direction orthogonal to the first direction. Furthermore, outline of other inventions disclosed in the present application will be described below.

33. A method of manufacturing a semiconductor integrated circuit device comprising the steps of: (a) forming an aluminum-based metal film over a first insulation film over a first main surface of a semiconductor wafer; (b) forming a titanium nitride film over the aluminum-based metal film; (c) forming a composite film pattern which becomes a plurality of bonding pads by patterning a composite film containing the aluminum-based metal film and the titanium nitride film; (d) exposing an upper surface of each of the bonding pads by removing the titanium nitride film from the composite film pattern; (e) forming an insulation surface protective film over the first main surface of the semiconductor chip and over each of the bonding pads; and (f) forming a first opening in the insulation surface protective film over each of the bonding pads.

34. The method of manufacturing a semiconductor integrated circuit device according to above 33, wherein the bonding pads are arranged in a row in a first direction along an edge part of the chip.

35. The method of manufacturing a semiconductor integrated circuit device according to above 33 or 34, wherein the composite film pattern contains an aluminum-based wiring in the same layer as that of each bonding pad.

36. The method of manufacturing a semiconductor integrated circuit device according to above 35, wherein the insulation surface protective film covers an upper surface and side faces of the titanium nitride film.

37. The method of manufacturing a semiconductor integrated circuit device according to any one of above 33 to 36, wherein each bonding pad has a nearly rectangular shape, and has a bonding region to which the bonding wire is coupled and a contact region to which a probe needle contacts.

38. The method of manufacturing a semiconductor integrated circuit device according to any one of above 33 to 37, wherein an exposed part of each bonding pad is covered with an aluminum oxide-based passivation film except for a part of the contact region.

39. The method of manufacturing a semiconductor integrated circuit device according to any one of above 33 to 38, further comprising the step of (g) after the step (f), sealing the first main surface of the semiconductor chip, the bonding pads, and the insulation surface protective film by covering thereon with a halogen-free resin member.

40. The method of manufacturing a semiconductor integrated circuit device according to any one of above 33 to 39, wherein, after the step (d), the titanium nitride film is absent in the vicinity of each bonding pad of the wiring and is present in the other portions, in a second direction orthogonal to the first direction.

Furthermore, outline of other inventions disclosed in the present application will be described below.

1. A semiconductor integrated circuit device comprising: (a) a semiconductor chip having a first and a second main surface; (b) a multilayer wiring layer formed over the first main surface of the semiconductor chip: (c) an I/O circuit region formed over the first main surface of the semiconductor chip; (d) an aluminum-based metal film pattern provided over the multilayer wiring layer and having a bonding pad part and a wiring part coupling the bonding pad part and the I/O circuit region with each other; (e) a titanium nitride film covering an upper surface of the aluminum-based metal film pattern; (f) an insulation surface protective film covering upper surfaces of the multilayer wiring layer, the aluminum-based metal film pattern, and the titanium nitride film; (g) a bonding pad opening formed by penetrating through the titanium nitride film and the insulation surface protective film so as to correspond to the inside of the bonding pad part; and (h) a titanium nitride film removing part provided over the aluminum-based metal film pattern at a part of area except for the bonding pad opening, wherein the bonding pad opening and the titanium nitride film removing part are not coupled to each other.

2. The semiconductor integrated circuit device according to above 1, wherein the titanium nitride film removing part has a first titanium nitride film removing part provided in a ring shape so as to surround the bonding pad opening inside the bonding pad part.

3. The semiconductor integrated circuit device according to above 1, wherein the titanium nitride film removing part has a second titanium nitride film removing part provided in the vicinity of the boundary between the bonding pad part and the circuit part.

4. The semiconductor integrated circuit device according to above 1, wherein the titanium nitride film removing part has a first titanium nitride film removing part provided in a ring shape so as to surround the bonding pad opening in the bonding pad part, and has a second titanium nitride film removing part provided in the vicinity of the boundary between the bonding pad part and the circuit part.

5. The semiconductor integrated circuit device according to any one of above 1 to 4, wherein the titanium nitride film removing part is covered with the insulation surface protective film.

6. The semiconductor integrated circuit device according to any one of above 1 to 4, wherein the titanium nitride film removing part is not covered with the insulation surface protective film.

7. The semiconductor integrated circuit device according to any one of above 1 to 6, wherein the insulation surface protective film is a laminated film containing a silicon oxide-based film as a lower layer and a silicon nitride-based film as an upper layer.

8. The semiconductor integrated circuit device according to any one of above 2 and 4 to 7, wherein the width of the first titanium nitride film removing part is in a range from 0.3 to 2 micrometer.

9. The semiconductor integrated circuit device according to any one of above 3 to 8, wherein the width of the second titanium nitride film removing part is in a range from 0.3 to 10 micrometer.

10. The semiconductor integrated circuit device according to any one of above 1 to 9, wherein the width of the bonding pad part is larger than that of the titanium nitride film removing part.

11. The semiconductor integrated circuit device according to any one of above 1 to 10, wherein the bonding pad opening has a rectangular shape.

12. The semiconductor integrated circuit device according to above 11, wherein the bonding pad opening has a wire bonding region and a wafer test probe contact region.

13. The semiconductor integrated circuit device according to above 12, further comprising (i) a probe mark formed in the upper surface of the aluminum-based metal film pattern in the wafer test probe contact region.

14. The semiconductor integrated circuit device according to above 12 or 13, further comprising (j) a bonding wire coupled to the wire bonding region.

15. The semiconductor integrated circuit device according to any one of above 1 to 14, further comprising (k) a sealing resin member covering the first main surface side of the semiconductor chip.

16. The semiconductor integrated circuit device according to above 15, wherein the sealing resin member is substantially halogen-free.

17. The semiconductor integrated circuit device according to above 13, wherein an exposed part of the aluminum-based metal film pattern is covered with a passivation film except for the portion of the probe mark.

18. A semiconductor integrated circuit device comprising: (a) a semiconductor chip having a first and a second main surface; (b) a multilayer wiring layer formed over the first main surface of the semiconductor chip; (c) an I/O circuit region formed over the first main surface of the semiconductor chip; (d) a plurality of aluminum-based metal film patterns provided over the multilayer wiring layer and having a bonding pad part and a wiring part coupling the bonding pad part and the I/O circuit region with each other; (e) a titanium nitride film covering an upper surface of each of the aluminum-based metal film patterns; (f) an insulation surface protective film formed so as to cover upper surfaces of the multilayer wiring layer, the aluminum-based metal film pattern, and the titanium nitride film; (g) a bonding pad opening formed by penetrating through the titanium nitride film and the insulation surface protective film so as to correspond to the inside of the bonding pad part; and (h) a titanium nitride film removing part provided over a part of the aluminum-based metal film pattern so as to contain entire area of the bonding pad part except for the bonding pad opening, wherein the bonding pad opening and the titanium nitride film removing part are coupled to each other over the entire periphery thereof.

19. The semiconductor integrated circuit device according to above 18, wherein the bonding pad parts are arranged in a row in a first direction along the edge part of the chip.

20. The semiconductor integrated circuit device according to above 18 or 19, wherein the upper surface of each aluminum-based metal film pattern at least at near the I/O circuit region of the wiring part is covered with the titanium nitride film.

21. The semiconductor integrated circuit device according to any one of above 18 to 20, wherein the titanium nitride film removing part is covered with the insulation surface protective film.

22. The semiconductor integrated circuit device according to any one of above 18 to 21, wherein the insulation surface protective film is a laminated film containing a silicon oxide-based film as a lower layer and a silicon nitride-based film as an upper layer.

23. The semiconductor integrated circuit device according to any one of above 18 to 22, wherein the bonding pad opening has a rectangular shape.

24. The semiconductor integrated circuit device according to above 23, wherein the bonding pad opening has a wire bonding region and a wafer test probe contact region.

25. The semiconductor integrated circuit device according to above 24, further comprising (i) a probe mark formed in the upper surface of each aluminum-based metal film pattern in the wafer test probe contact region.

26. The semiconductor integrated circuit device according to above 24 or 25, further comprising (j) a bonding wire coupled to the wire bonding region.

27. The semiconductor integrated circuit device according to any one of above 18 to 26, further comprising (k) a sealing resin member covering the first main surface side of the semiconductor chip.

28. The semiconductor integrated circuit device according to above 27, wherein the sealing resin member is substantially halogen-free.

29. The semiconductor integrated circuit device according to above 25, wherein the exposed part of the aluminum-based metal film pattern is covered with a passivation film except for the portion of the probe mark.

Explanation of the Description Type, Basic Terminology and Use Thereof in the Present Application 1. While the description of the embodiment is sometimes divided as needed into a plurality of sections for convenience in the present application, these divided descriptions are not independent or different from one another, but they are respective parts of one example, one of them is partial details of another one, or they are modifications or the like of a part of or a whole of the embodiment, except when it is explicitly indicated in particular that this is not the case. Further, in principle, repeated explanation is omitted for the same part. In addition, each constituent of the embodiment is not essential except when it is explicitly indicated in particular that this is not the case, except when the number of the constituents is determined theoretically, and except when it is clear from a context that this is not the case.

Further, in the present application, the "semiconductor integrated circuit device" means a device mainly integrating various transistors (active elements) in particular together with a resistor, a capacitor, and the like (e.g., a single crystal silicon substrate) over a semiconductor chip or the like. Typical products of the above-described "various transistors" include MISFET (Metal Insulator Semiconductor Field Effect Transistor) represented by MOSFET (Metal Oxide Semiconductor Field Effect Transistor). Typical integrated circuit structure includes CMIS (Complementary Metal Insulator Semiconductor) type integrated circuit represented by CMOS (Complementary Metal Oxide Semiconductor) type integrated circuit combining N-channel type MISFET with P-channel type MIFET.

The current semiconductor integrated circuit device, or the wafer process of LSI (Large Scale Integration), is generally divided into two stages: the first is FEOL (Front End of Line) stage beginning from the step of carry-in of silicon wafer as the raw material to around the premetal step comprising the formation of interlayer insulation film between the lower end of M1 wiring layer and the gate electrode structure, the formation of contact hole, the tungsten plug, the burying, and the like; and the second is BEOL (Back End of Line) stage beginning from the step of forming the M1 wiring layer to around the step of forming the pad opening in the final passivation film over the aluminum-based pad electrode, (wafer level package process includes the process). As for the FEOL stage, the step of gate electrode pattering, the step of contact hole forming, and the like are fine-processing steps requiring specially fine processing. On the other hand, the BEOL stage requires specially fine processing in the step of via and trench forming, specifically in the local wiring at relatively low layers (for example, copper-based damascene type buried wiring of about six layers requires fine burying wiring from M1 to around M4) or the like. The term "MN (normally N=about 1 to about 15)" signifies the wiring at Nth layer (counted from bottom). That is, "M1" signifies the wiring in the first layer, and M3 signifies the wiring in the third layer. According to the example given here, there are six layers of metal wiring under the aluminum-based pad electrode layer and the tungsten via layer directly beneath the aluminum-based pad electrode layer.

2. Similarly in the description of the embodiments, even when a material, a composition, or the like is described as "X composed of A" or the like, a material, a composition, or the like including an element except A as a constituent is not excluded except when it is explicitly indicated in particular that this is not the case, and except when it is clear from a context that this is not the case. For example, the above expression means "X including A as a main component" for the composition. In detail, similar translation is applied to copper wiring, gold wiring, titanium nitride, aluminum layer, polyimide layer, and the like.

Obviously, "silicon material" or the like, for example, is not limited to pure silicon, but includes also a SiGe alloy and a multi-component alloy containing silicon as a main component, and further includes also a silicon material containing another additive or the like. Similarly, the terms "silicon oxide film" and "silicon oxide-based insulation film" naturally include: relatively pure undoped silicon dioxide; FSG (fluorosilicate glass); TEOS-based silicon oxide; SiOC (silicon oxycarbide); carbon-doped silicon oxide; thermally oxidized film such as OSG (organosilicate glass), PSG (phosphorus silicate glass), BPSG (borophosphosilicate glass), PSG (phosphorus silicate glass), and BPSG (borophosphosilicate glass); CVD oxide film; coating type silicon oxide such as SOG (spin ON glass) and NSC (nano-clustering silica); silica-based Low-k insulation film (porous insulation film) introducing void to a member similar to above; and composite film with other silicon-based insulation film having above material as the main structural element.

Along with the silicon oxide-based insulation film, silicon nitride-based insulation film is commonly used in the semiconductor field as the silicon-based insulation film. Materials for the silicon nitride-based film include SiN, SiCN, SiNH, and SiCNH. The term "silicon nitride" referred to herein includes both SiN and SiNH unless explicitly indicated otherwise. Similarly, the term "SiCN" includes both SiCN and SiCNH unless explicitly indicated otherwise.

Although SiC has similar properties with those of SiN, SiON is often classified to the silicon oxide-based insulation film.

The silicon nitride film is widely used as the etch-stopping film in the SAC (Self-Aligned Contact) technology, and is also used as the stress-imparting film in SMT (Stress Memorization Technique).

3. Similarly for shape, a position, an attribute, or the like, while they are illustrated with respective preferable examples, obviously each of them is not limited strictly to the preferable example except when it is explicitly indicated in particular that this is not the case and except when it is clear from a context that this is not the case.

4. Further, when a specific numerical value or amount is mentioned, the numerical value or amount may be a numerical value exceeding the specific numerical value or a numerical value smaller than the specific numerical value except when it is explicitly indicated in particular that this is not the case, except when the numerical value is limited to the specific numerical value theoretically, and except when it is clear from a context that this is not the case.

5. While usually a "wafer" indicates a single crystal silicon wafer on which the semiconductor integrated circuit device (also, semiconductor device and electronic device) is formed, a "wafer" obviously includes an epitaxial wafer, an SOI substrate, an insulating substrate such as an LCD glass substrate, a composite wafer of semiconductor layers, and the like. The same is applied also to the wafer used in the following embodiments.

Detail Description of the Embodiments

Details of the embodiments will be described further. In each of the drawings, the same or a similar part is indicated by the same or a similar symbol or reference number and explanation will not be repeated in principle.

Further, in the accompanying drawings, hatching or the like is omitted even from a cross section when the drawing is made complicated on the contrary or when the cross section is clearly divided from a vacant space. In a related matter, an outline in the back is sometimes omitted even from a hole closed in a planar view when this is clear in explanation or the like. Moreover, hatching is provided even for a part which is not a cross section in order to show the part is not a vacant space.

1. Description of the semiconductor integrated circuit device and the method of manufacturing the same of Embodiment 1 of the present application (mainly from FIG. 1 to FIG. 11)

The description is given referring to an example of 90 nm technology-node highly-reliable CMIS LIS device. The description begins from the outline of the layout of LSI device to which the pad-peripheral structure as the core part of the device structure of the present application is applied, and the structure of package to which the LSI device is incorporated, in the sub-section (1-1).

The characteristic of the structure peripheral to the pad according to Embodiment 1 is to form a space around the bonding pad opening of each bonding pad part beneath the final passivation film, thus forming a ring-shape region where the upper layer barrier metal layer is removed. The ring-shape region is located at all around the bonding pad opening to eliminate all the origins of the titanium oxidation because the origin of titanium oxidation exists at boundary of the bonding pad opening. That is, even when the abnormal oxidation of titanium occurs at any point on the outer periphery of the bonding pad opening, short total length of the periphery brings the stress small and prevents the crack generation in the inorganic passivation film and the like (including auxiliary insulation film).

As described in Section 2, since the portion specifically sensitive to the abnormal oxidation of titanium is at the wiring part of the bonding pad, the ring-shape titanium nitride film removing part is not necessarily formed in a shape of closing over the entire periphery. For example, the titanium nitride film removing part may be given in a linear pattern only at a region 32 in the vicinity of boundary (FIG. 3 and other drawings), or the portion centering on the region 32. When, however, even for an abnormal oxidation of titanium generated at a portion different from the wiring side of the bonding pad, once the resulting cracks occurred in the inorganic insulation film, moisture may condense in the cracks to become a new source of abnormal oxidation. For improving further the reliability therefore, it is preferable to form the pattern in totally closed shape.

The description gives an integral ring-shape (closed shape) as the ring-shape titanium nitride film removing part. The shape may be separated rings (such as a group of dots arranged in ring shape). Nevertheless, integral shape provides larger capacity to cut off the propagation route of abnormal oxidation of titanium developing to cracks of inorganic passivation film and the like.

There may be an applicable method of covering the side face of outer periphery of the bonding pad opening from outside to inside thereof by a moisture-resistant inorganic insulation film. The method, however, has problems such as increasing in the number of etching cycles and of roughening of upper surface of the aluminum-based metal.

1-1. Example of layout inside the chip of the semiconductor integrated circuit device common to Embodiments 1 to 5 of the present application (mainly FIG. 1 and FIG. 2)

Figure 2:
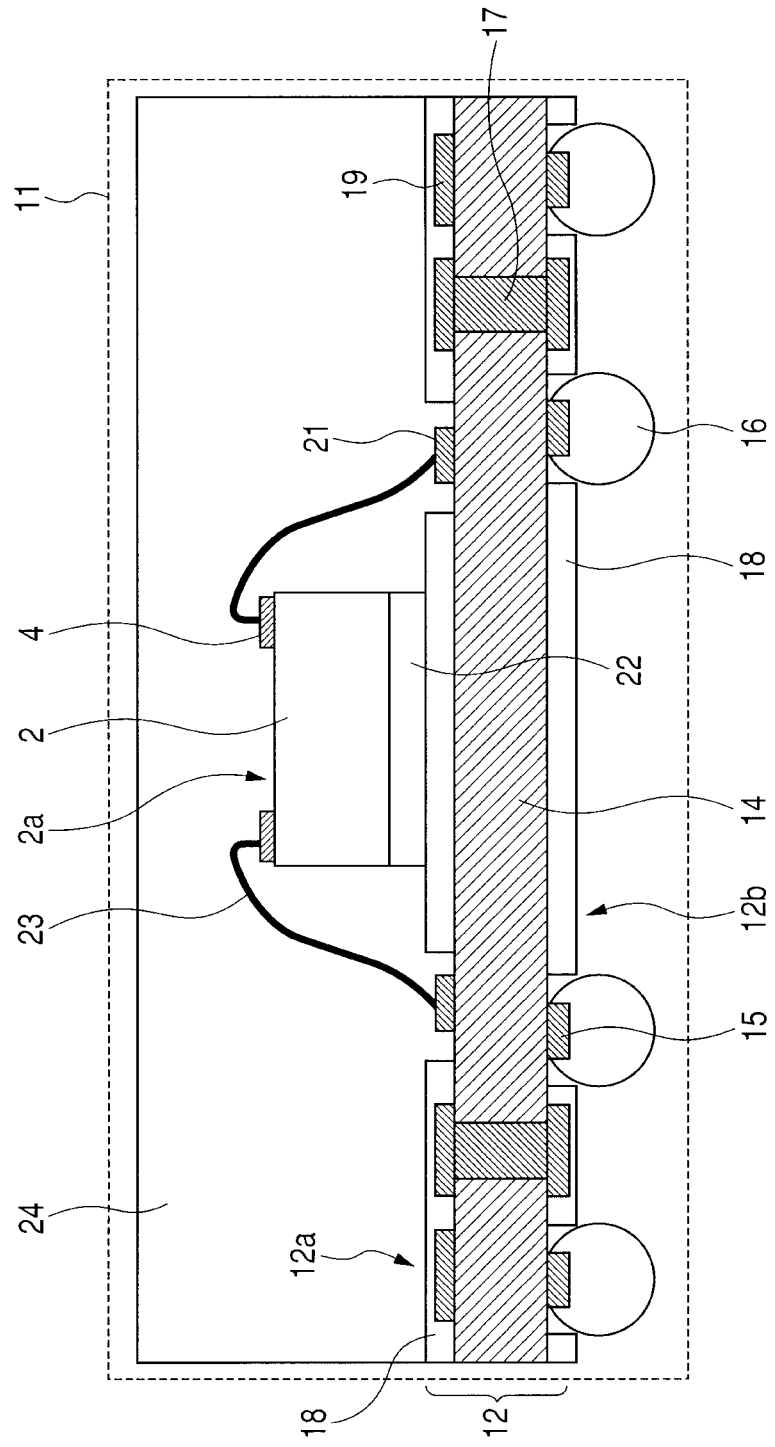
FIG. 2 illustrates a front cross sectional view of a BGA package with the chip in FIG. 1 sealed.

FIG. 1 is a schematic plan view illustrating a layout inside the chip of the semiconductor integrated circuit device, (first main surface), of Embodiment 1 of the present application, (same is applied to Embodiments 2 to 5). FIG. 2 illustrates a front cross sectional view of the BGA package with the chip in FIG. 1 sealed.

The description begins with the outline of layout in the chip of the semiconductor integrated circuit device of Embodiment 1 of the present application, (same is applied to Embodiments 2 to 5). As illustrated in FIG. 1, a core circuit region 9 is provided at a center part of a first main surface 2a (opposite side to the rear face or a second main surface 2b) of, for example, a silicon-based semiconductor chip 2. An I/O circuit region 6 is provided surrounding the core circuit region 9, which I/O circuit region 6 contains a ring-shape power source Vdd trunk wiring 8 (composed of, for example, an aluminum pad layer), a ring-shape power source Vss trunk wiring 7 (composed of, for example, an aluminum pad layer), and a number of I/O circuits. At other area from the I/O circuit region 6 in the peripheral area of the chip 2, there are arranged a series of bonding pad rows 5 structured by the bonding pads 4 (bonding pad parts) along each side of the chip 2. The bonding pad 4 is structured by an aluminum pad layer. At the peripheral edge part of the chip 2 outside the bonding pad rows 5, a guard ring 3 is provided so as to surround the peripheral area of the chip 2. The metal layer as the uppermost layer of the guard ring 3 is made of, for example, aluminum pad layer. The enlarged part R in peripheral area of the pad is described in FIG. 3 and the like. The bonding pad 4 given here as an example has a nearly rectangular shape (corner part may have a round part, and peripheral area may have a deformed part as mark and the like). The bonding pad 4 may have a square shape or may have a shape containing sloping line or curve. The description adopts an example of placing the I/O circuit region 6 between the core circuit region 9 and the region arranging the bonding pad rows 5. However, the I/O circuit region 6 may be placed in a region between the core circuit region 9 and the guard ring 3. In that case, effective use of the space can be improved because the I/O circuit can also be placed beneath the bonding pad row 5. On the other hand, for the example of locating the I/O circuit region 6 between the core circuit region 9 and the region of placing the bonding pad row 5, reliability can be improved because a distance is secured between the bonding pad 4 and the I/O circuit region 6.

FIG. 2 illustrates across sectional view of a BGA package 11 as an example of ultimate use mode of the chip. The ultimate use mode may be, other than the BGA package, WLP (Wafer Level Package) or other package type. As illustrated in FIG. 2, a wiring substrate 12 (interposer, single layer or multilayer wiring substrate) has, for example, a glass-epoxy-based organic wiring substrate core material 14 with a through hole (via) 17. At upper surface 12a and lower face 12b of the organic wiring substrate core material 14, there are attached a bump land 15, a substrate wiring 19, an external lead 21, and the like. A solder resist film 18 is overlaid thereon at need. A solder bump 16 for coupling the package is formed over the bump land 15. Onto the upper surface 12a of the wiring substrate 12, the semiconductor chip 2 is die-bonded via an adhesive layer 22 such as DAF (Die Attach Film). Each bonding pad 4 on the surface 2a of the semiconductor chip 2 is coupled to the external lead 21 by, for example, a gold bonding wire 23 containing gold as the main component. The upper surface 12a of the wiring substrate 12 is sealed with a sealing resin 24 containing, for example, epoxy-based resin as the main resin component so as to seal the upper surface 2a of the chip 2 and the wire 23 inside the assembly.

The individual sealing resin used herein is preferably a "halogen-free resin" containing no halogen substance (specifically bromine) in the fire retardant in view of environmental concern and the like. From the point of reliability of sealing, however, the halogen-free resin likely contains other halogen elements such as chlorine in larger quantity than that in ordinary resins. That is, based on the WEEE (Waste Electrical and Electronic Equipment) Command, there have been increased the request of halogen-free for the package material for semiconductor chip: (1. chlorine (Cl) content of resin: 0.09% by weight or less, 2. bromine (Br) content of resin: 0.09% by weight or less, and 3. antimony (Sb) content of resin: 0.09% by weight or less). However, the changes of package materials raised problems which were not obvious. That is, the voltage-application test in high-temperature and high-humidity environment after the product assembly revealed that there likely occurred that the titanium nitride film over aluminum was oxidized at the side wall of pad part subjected to positive voltage, thus generated the separation of titanium nitride film from upper film, and that the oxidation of titanium nitride film induced cracks by the volume expansion, thus resulted in the chip destruction failure.

1-2. Description of the structure peripheral to the pad of the semiconductor integrated circuit device and the method of manufacturing thereof in Embodiment 1 of the present application (mainly FIG. 3 to FIG. 11)

Figure 3:
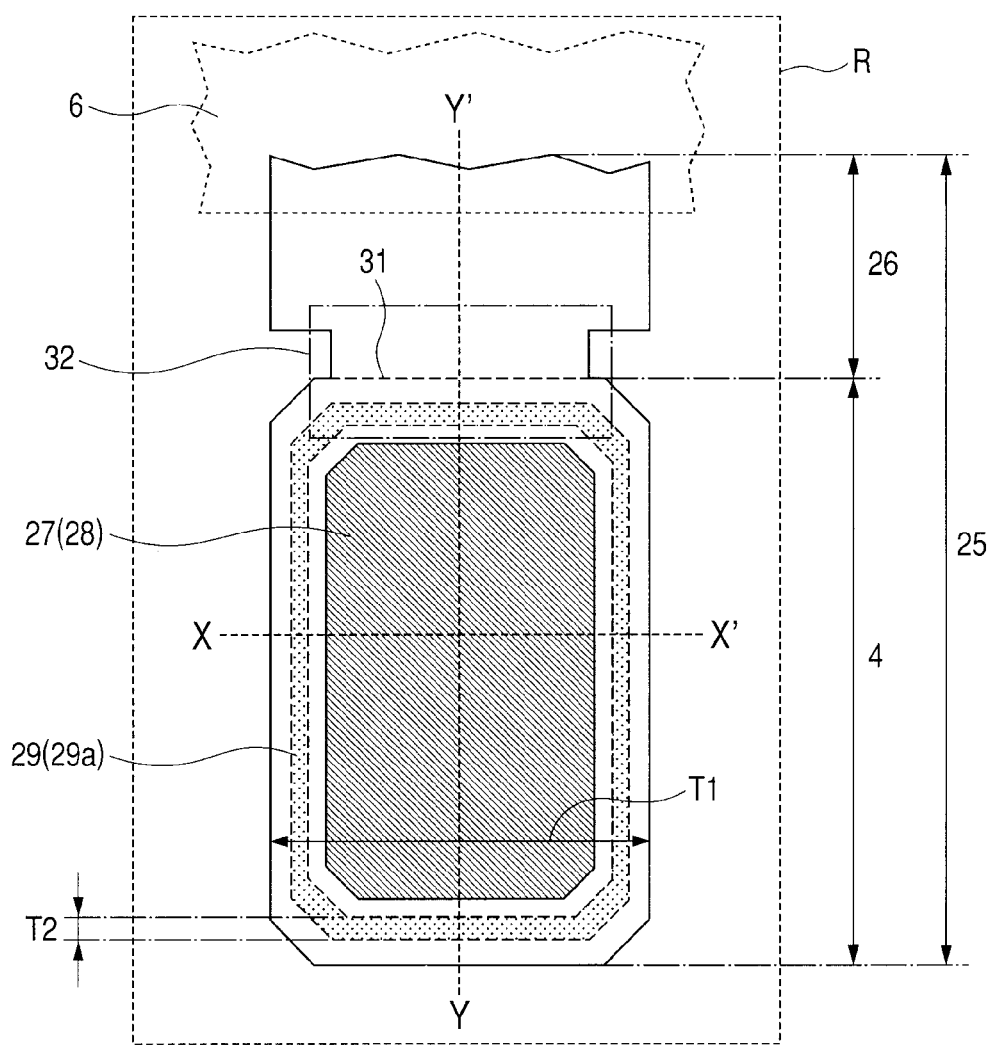
FIG. 3 illustrates an enlarged plan view of peripheral area of a bonding pad part corresponding to an enlarged part R in peripheral area of the pad, in the layout inside the chip (first main surface) of the semiconductor integrated circuit device of Embodiment 1 of the present application.
Figure 4:
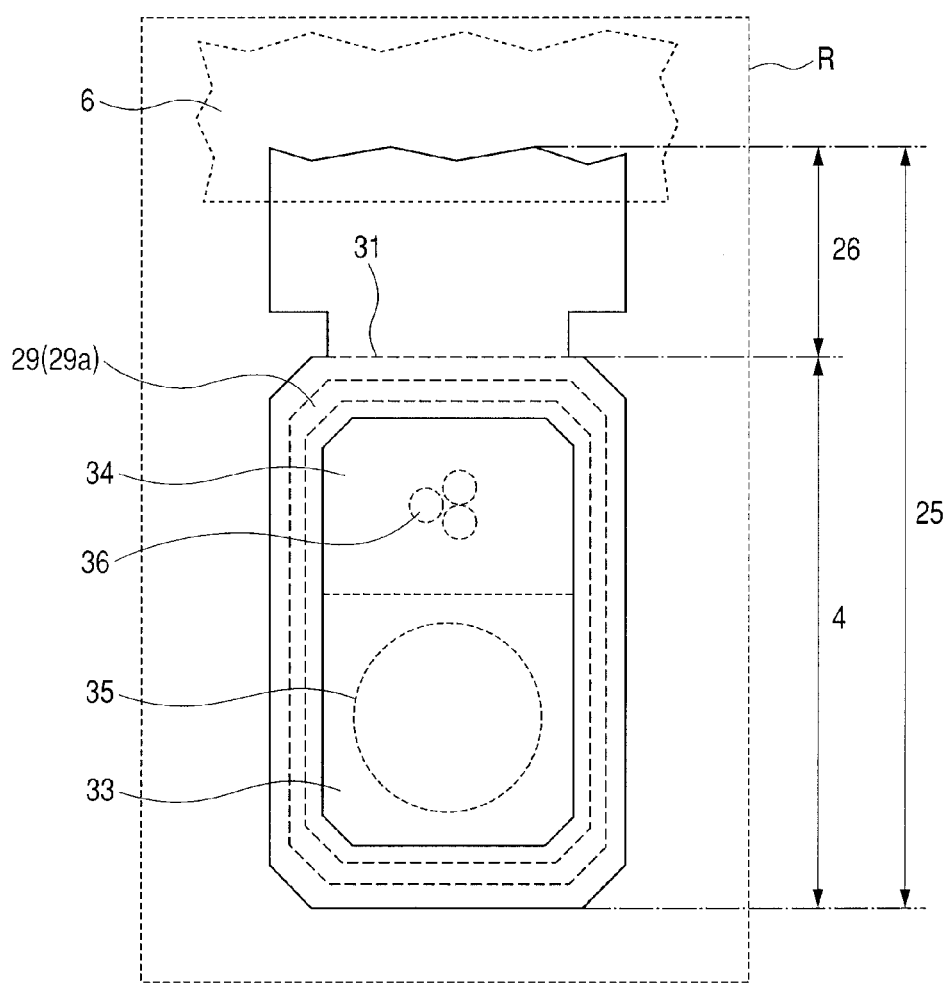
FIG. 4 illustrates an enlarged plan view of peripheral area of the bonding pad part, giving the state after wire bonding at a portion corresponding to FIG. 3.
Figure 5:
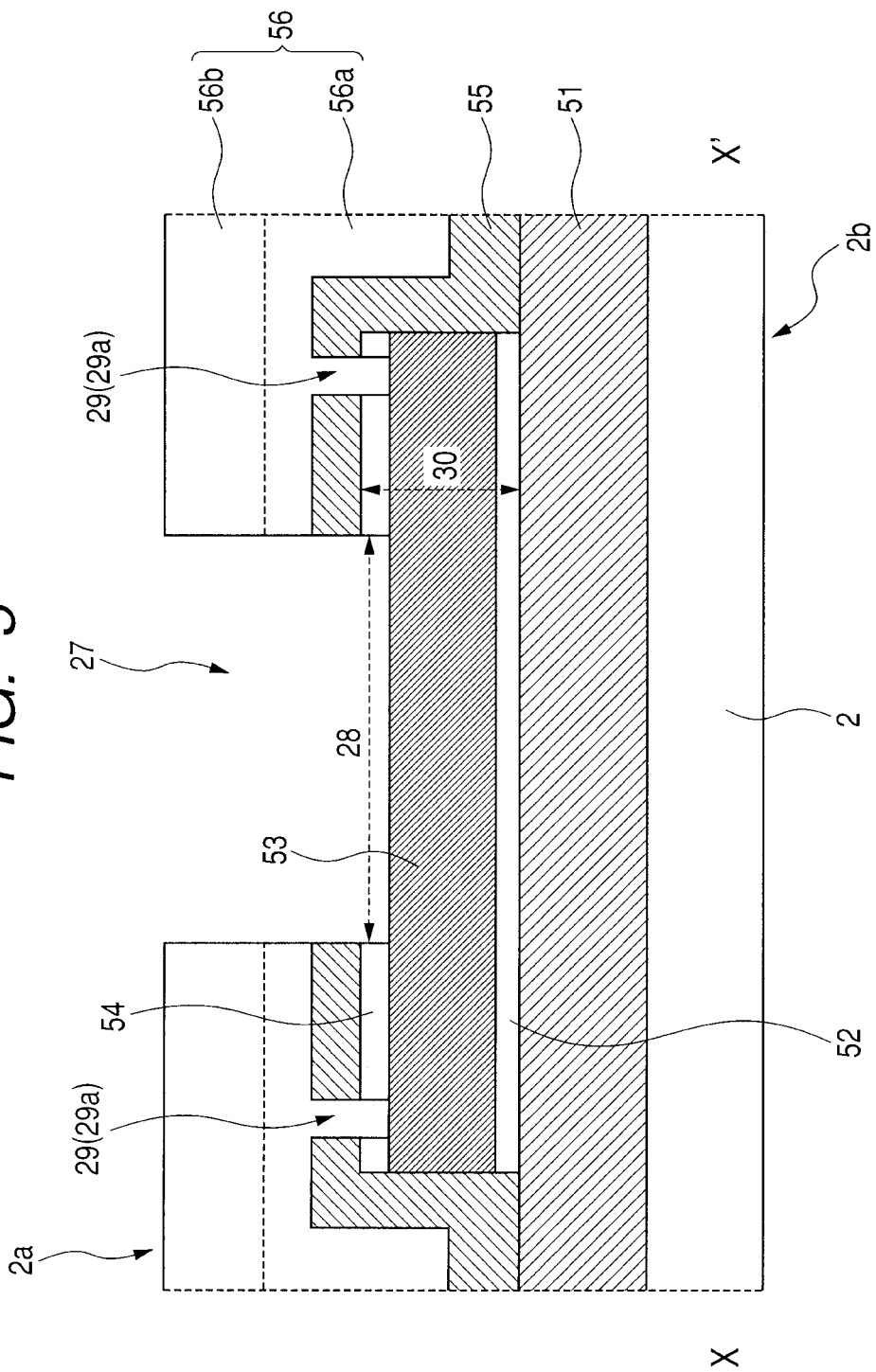
FIG. 5 illustrates a chip cross sectional view of X-X' section in FIG. 3.
Figure 6:
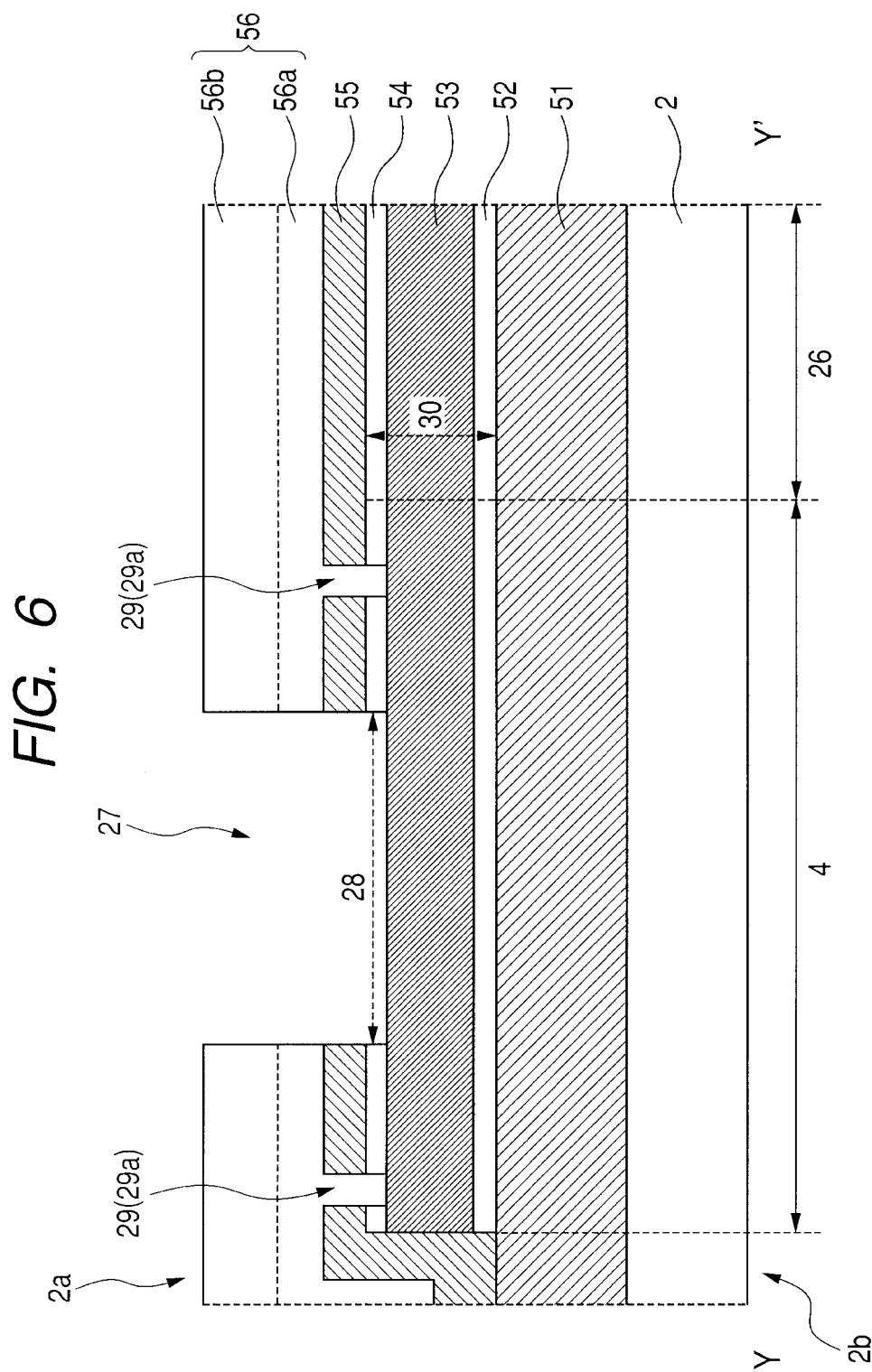
FIG. 6 illustrates a chip cross sectional view of Y-Y' section in FIG. 3.

FIG. 3 illustrates an enlarged plan view of peripheral area of the bonding pad part corresponding to the enlarged part R in peripheral area of the pad, in the layout inside the chip (first main surface) of the semiconductor integrated circuit device of Embodiment 1 of the present application. FIG. 4 illustrates an enlarged plan view of peripheral area of the bonding pad part, giving the state after wire bonding at a portion corresponding to FIG. 3. FIG. 5 illustrates a chip cross sectional view of X-X' section in FIG. 3. FIG. 6 illustrates a chip cross sectional view of Y-Y' section in FIG. 3.

In the layout inside the chip, (first main surface), of the semiconductor integrated circuit device of Embodiment 1 of the present application, the description is given on the structure in plane peripheral to the bonding pad part corresponding to the enlarged part R in peripheral area of the pad. As illustrated in FIG. 3 (at the point of completion of forming the bonding pad opening for the inorganic final passivation) and in FIG. 4 (at the point of completion of wire bonding), an aluminum-based metal film pattern 25 (corresponding to the aluminum pad layer) is divided into the bonding pad part 4 and a wiring part 26 which couples the bonding pad part 4 and the I/O circuit region 6. The area in the vicinity of a boundary 31 between the bonding pad part 4 and the I/O circuit region 26 is defined as a region 32 in the vicinity of boundary. The center part of the bonding pad part 4 is a bonding pad opening 27 (a first opening part 28 of the titanium nitride film in FIGS. 5 and 6). At peripheral area of the bonding pad part 4 around the bonding pad opening 27, there is provided a first titanium nitride film removing part 29a, in a ring shape, (ring-shape titanium nitride film removing part or a second opening part 29) with a space from the bonding pad opening 27. The width T1 of the bonding pad part is, for example, about 50 micrometer (length of major side is, for example, about 80 micrometer), and the width T2 of the ring-shape titanium nitride film removing part is, for example, about 0.9 micrometer (for example, about 0.3 to about 2 micrometer is a preferable range). The width of the space inside the ring-shape titanium nitride film removing part 29a is, for example, about 0.9 micrometer (example of preferred range is approximately from 0.3 to 2 micrometer), and the width of the external space is, for example, about 0.7 micrometer (example of preferred range is approximately from 0.3 to 2 micrometer).

As illustrated in FIG. 4, at the point of completion of wire bonding, a wafer test probe contact region 34 in the bonding pad opening 27 (FIG. 3) has probe marks 36, and a wire bonding region 33 has a bonding wire junction 35 formed. Although dividing the region as above is not essentially required, dividing the region can improve the wire bonding characteristics.

As in this Embodiment, when the bonding pad part 4 has the wire bonding region 33 and the wafer test probe contact region 34, the probe marks 36 formed in the wafer test probe contact region 34 scrapes off the alumina film on the surface of an aluminum-based metal film 53 by the passivation treatment described later. Then, the wafer test probe contact region 34 exposes in a state that the aluminum-based metal film 53 is scraped out, which increases the possibility of generation of electrochemical reaction in the aluminum-based metal film 53 caused by moisture entering from outside. Furthermore, a barrier metal film 54 near the wafer test probe contact region 34 is likely affected to become the propagation route of abnormal oxidation of titanium. Since the wafer test probe contact region 34 is closer to the I/O circuit region 6 rather than to the wire bonding region 33, the measures as described in this Embodiment is further effective. The structure of providing the wire bonding region 33 and the wafer test probe contact region 34 in the bonding pad part 4 is applicable to other Embodiments.

Next, the description is given to the X-X' section in FIG. 3. As illustrated in FIG. 5, for example, there is a multilayer wiring layer 51 (as an example, a six layer wiring of copper-based damascene wiring is assumed herein, with a tungsten via layer over the M6 wiring at the uppermost layer) at the upper surface 2a side of the silicon single crystal substrate 2 (such as P-type silicon substrate) having a region doped with various kinds of impurities. An aluminum pad layer 30 (metal composite film) is composed of, for example, a barrier metal film 52 as the lower layer, the aluminum-based metal film 53, the barrier metal film 54 (anti-reflection film) as the upper layer. The barrier metal film 52 as the lower layer is structured by, for example, a titanium film (with about 10 nm of thickness, for example) as the lower layer and a titanium nitride film (with about 60 nm of thickness, for example) as the upper layer. The aluminum-based metal film 53 as the middle layer is a metal film containing, for example, aluminum with about 1000 nm in thickness as the main component. The metal film generally contains copper and the like as the additives by several percentages. As the materials for the barrier metal, there are used films of titanium, titanium nitride, titanium-tungsten, and a composite thereof other than the metals given above. Also the barrier metal film 54 as the upper layer can be formed as laminated structure similar to the barrier metal film 52 as the lower layer. The aluminum pad layer 30 is overlaid with an auxiliary insulation film 55 (such as silicon oxide-based film with about 200 nm of thickness prepared by plasma CVD) for processing. The auxiliary insulation film 55 has an inorganic final passivation film 56 (insulation surface protective film) thereon. An example of the inorganic final passivation film 56 is a laminated inorganic final passivation film composed of a silicon oxide-based protective film 56a (such as a silicon oxide-based film with about 200 nm of thickness prepared by plasma CVD) as the lower layer, a silicon nitride-based protective film 56b (such as a silicon nitride-based film with about 600 nm of thickness prepared by plasma CVD) as the upper layer, and the like. The inorganic final passivation film 56 is not limited to a laminate, and a single layer film of silicon nitride-based film and the like may be applied. Furthermore, an organic final passivation film such as polyimide-based resin film may be further formed over the inorganic final passivation film 56.

As illustrated in FIG. 5, at center part of the bonding pad, there is the bonding pad opening 27 penetrating through the inorganic final passivation film 56, the auxiliary insulation film 55, the barrier metal film 54 as the upper layer, and the like. In this state, the barrier metal film 54 as the upper layer of the bonding pad opening 27 is removed to secure the wire bonding characteristics and the probe characteristics. The opening part 28 thereof agrees in plane with the bonding pad opening 27. The surface of the aluminum-based metal film 53 of the portion of bonding pad opening 27 is subjected to passivation treatment (oxidation treatment), and the surface is protected by a dense and thin alumina-based film. At peripheral area of the bonding pad opening 27, there is provided the titanium nitride film removing part 29 (second opening part or the first titanium nitride film removing part 29a) described before. In this example, the first titanium nitride film removing part 29a is covered with the inorganic final passivation film 56. That is, the opening part 29 is positioned between the opening 27 and the edge part of the bonding pad part 4, and is covered with the inorganic final passivation film 56.

Then, the description is given on the Y-Y' section in FIG. 3. As illustrated in FIG. 6, the wiring part 26 extends to Y' side, which is different from the cross section in FIG. 5.

Figure 7:
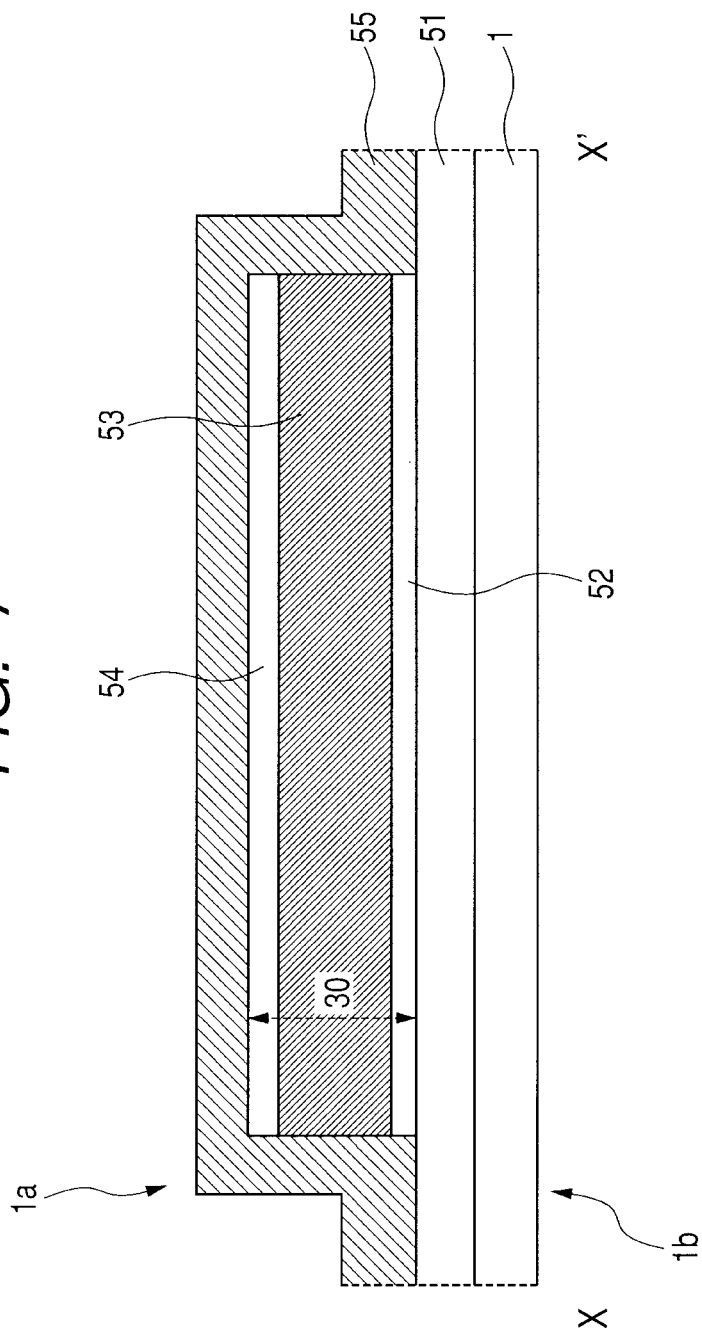
FIG. 7 illustrates a device cross sectional flow diagram (step of forming an auxiliary insulation film) corresponding to X-X' section in FIG. 3 in a method of manufacturing a semiconductor integrated circuit device of Embodiment 1 of the present application.
Figure 8:
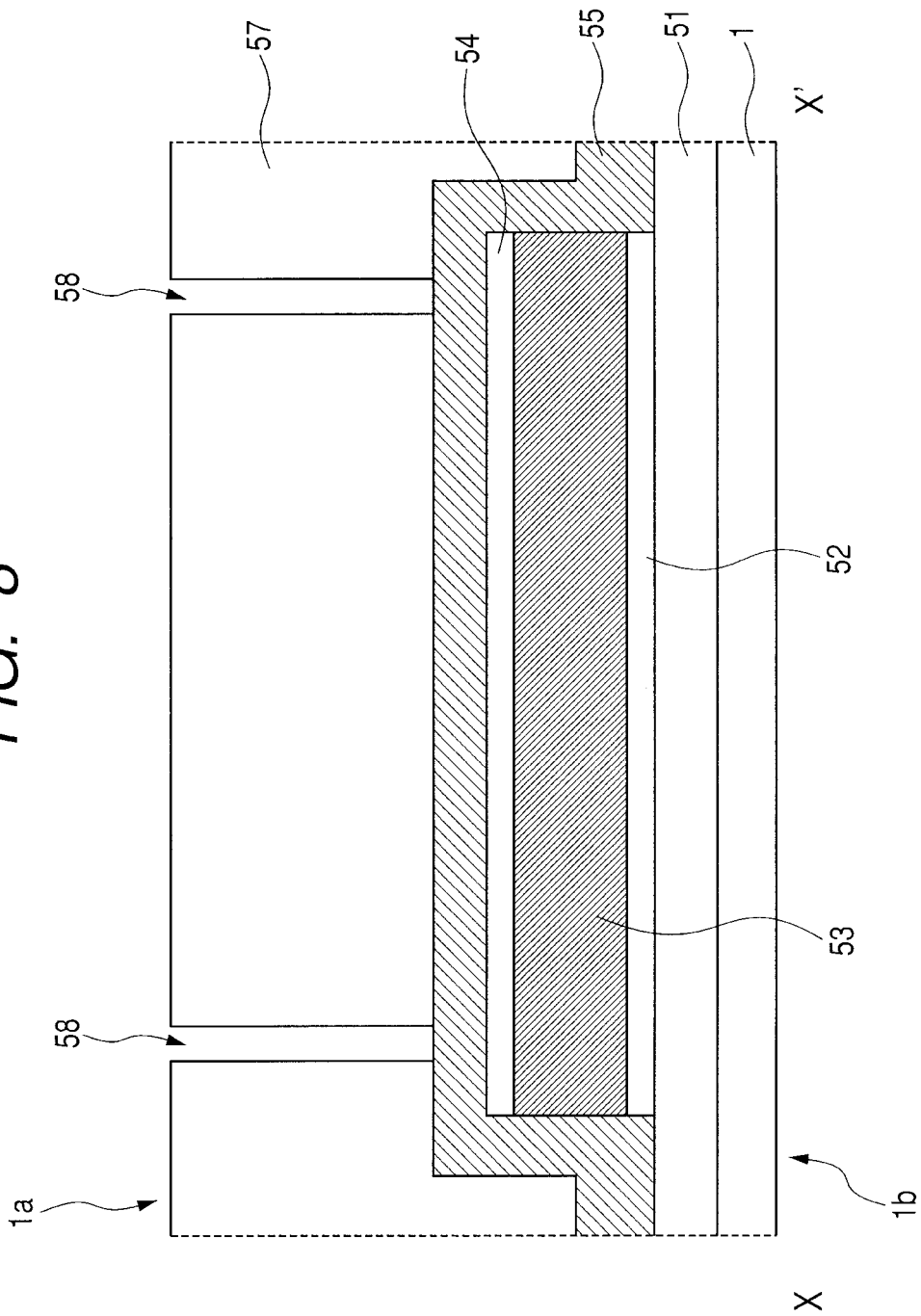
FIG. 8 illustrates a device cross sectional flow diagram (step of forming a resist film for patterning a titanium nitride film removing part) corresponding to X-X' section in FIG. 3 in the method of manufacturing a semiconductor integrated circuit device of Embodiment 1 of the present application.
Figure 9:
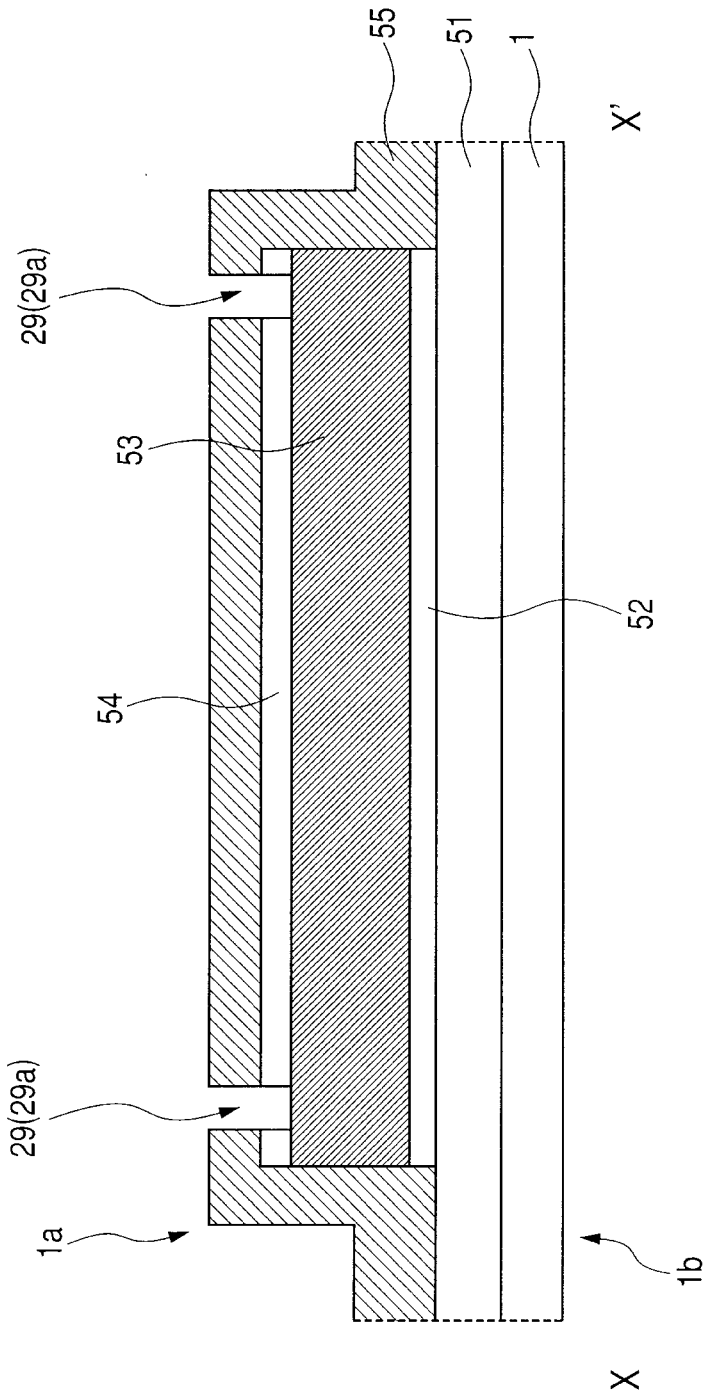
FIG. 9 illustrates a device cross sectional flow diagram (step of forming a titanium nitride film removing part) corresponding to X-X' section in FIG. 3 in the method of manufacturing a semiconductor integrated circuit device of Embodiment 1 of the present application.
Figure 10:
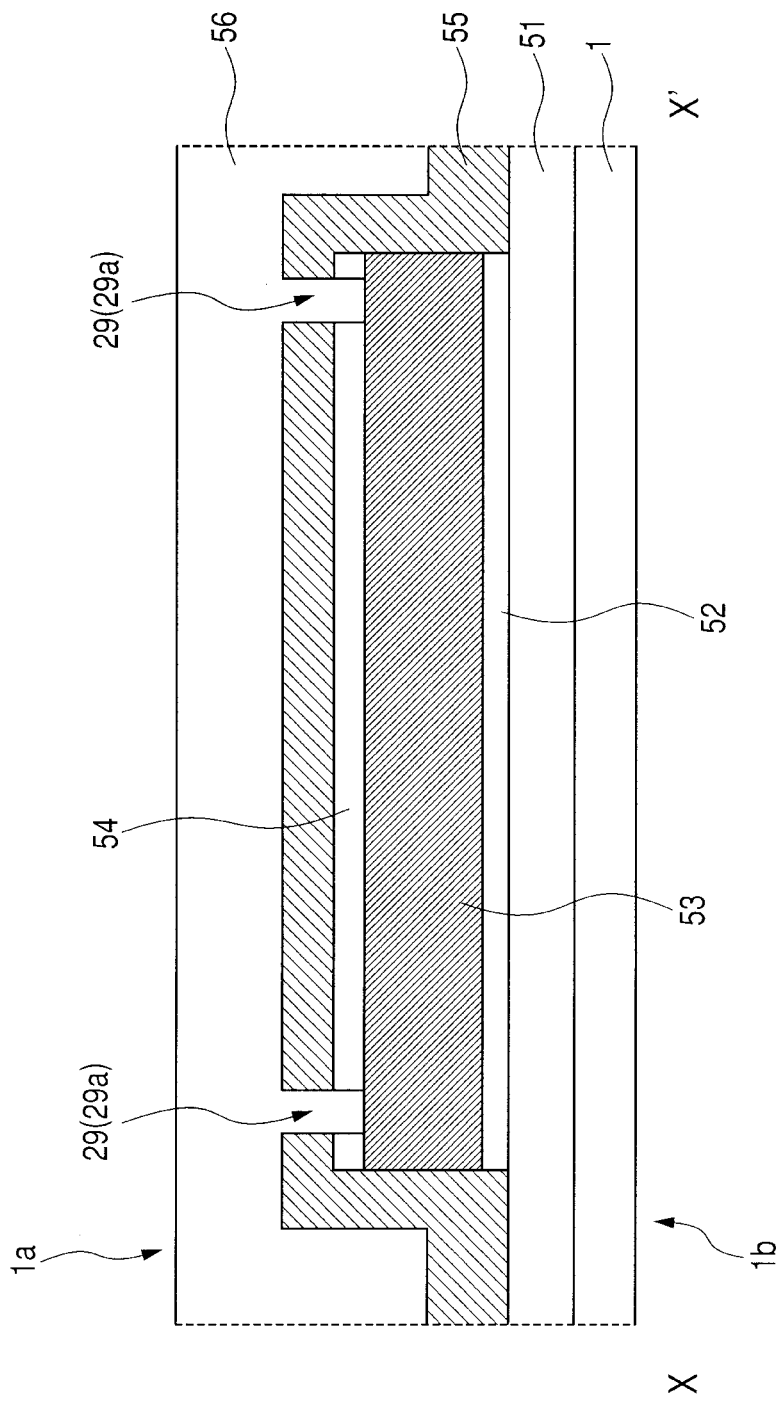
FIG. 10 illustrates a device cross sectional flow diagram (step of forming an insulation surface protective film) corresponding to X-X' section in FIG. 3 in the method of manufacturing semiconductor integrated circuit device of Embodiment 1 of the present application.
Figure 11:
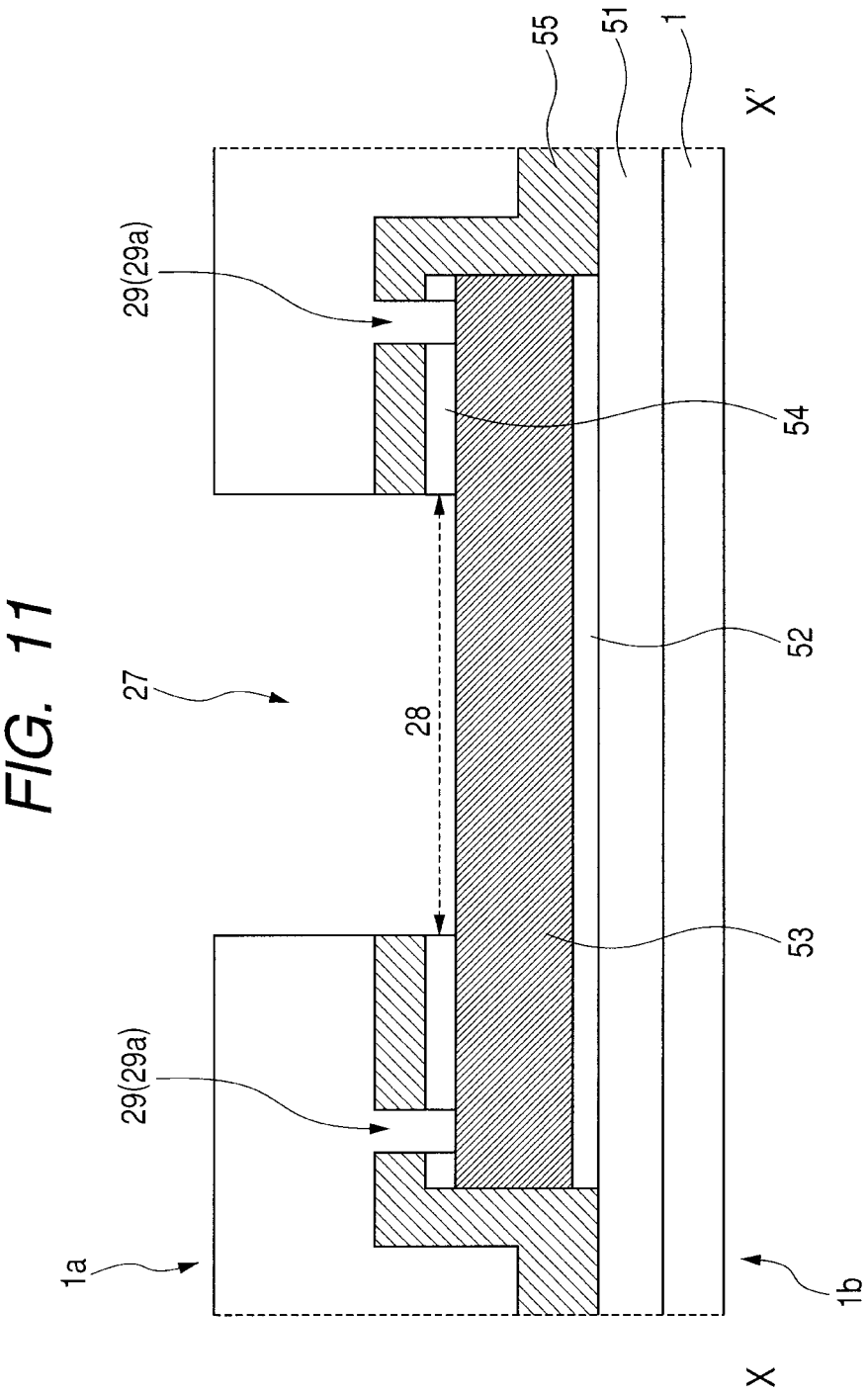
FIG. 11 illustrates a device cross sectional flow diagram (step of forming a pad opening) corresponding to X-X' section in FIG. 3 in the method of manufacturing a semiconductor integrated circuit device of Embodiment 1 of the present application.

FIG. 7 illustrates a device cross sectional flow diagram (step of forming an auxiliary insulation film) corresponding to X-X' section in FIG. 3 in the method of manufacturing a semiconductor integrated circuit device of Embodiment 1 of the present application. FIG. 8 illustrates a device cross sectional flow diagram (step of forming a resist film for patterning a titanium nitride film removing part) corresponding to X-X' section in FIG. 3 in the method of manufacturing a semiconductor integrated circuit device of Embodiment 1 of the present application. FIG. 9 illustrates a device cross sectional flow diagram (step of forming a titanium nitride film removing part) corresponding to X-X' section in FIG. 3 in the method of manufacturing a semiconductor integrated circuit device of Embodiment 1 of the present application. FIG. 10 illustrates a device cross sectional flow diagram (step of forming an insulation surface protective film) corresponding to X-X' section in FIG. 3 in the method of manufacturing a semiconductor integrated circuit device of Embodiment 1 of the present application. FIG. 11 illustrates a device cross sectional flow diagram (step of forming a pad opening) corresponding to X-X' section in FIG. 3 in the method of manufacturing a semiconductor integrated circuit device of Embodiment 1 of the present application. Based on these figures, the core process of the method of manufacturing a semiconductor integrated circuit device of Embodiment 1 will be described in the following.

As illustrated in FIG. 7, for example, using the front-end process and the back-end process for a P-type silicon single crystal wafer 1 with 300 mm in diameter (200 mm or 450 mm can be applied), there is prepared a wafer completing the patterning of the aluminum pad layer 30 (metal composite film) over the multilayer wiring layer 51. As described below, after processing the aluminum-based metal film by dry etching and the like, normally the treatment of passivation on the surface of exposed metal is given. Then, a silicon oxide film as the auxiliary insulation film 55 is formed to about 200 nm of thickness, for example, by plasma CVD over the almost entire surface of the device surface 1a of the wafer 1. The condition of film-forming is, for example, the gas flow rate ratio $SiH_4/N_2$ of about 0.5/10, the processing pressure of about 360 Pascal, and the wafer stage temperature of about 400° C.

Next, as illustrated in FIG. 8, a resist film 57 is coated on the device surface 1a of the wafer 1, and a resist film opening 58 is formed in the resist film 57 to execute patterning of the titanium nitride film removing part 29a by ordinary lithography.

Then, as illustrated in FIG. 9, the resist film pattern 57 is used as the mask to execute the dry etching (that is, the vapor phase plasma etching, same is applied to the following), thus forming an opening penetrating through the auxiliary insulation film 55 and the barrier metal film 54 as the upper layer, or forming the first titanium nitride film removing part (ring-shape titanium nitride film removing part) 29a or the second opening part (titanium nitride film removing part) 29. The dry etching is divided into the etching of silicon oxide film and the etching of titanium nitride film. The condition of etching of silicon oxide film is, for example, the gas flow rate $CF_4/CHF_3/O_2/Ar$ of 150/30/40/650 sccm, the processing pressure of about 27 Pascal, and the wafer stage temperature of about 60° C. The condition of etching of titanium nitride film is, for example, the gas flow rate C12/Ar of 30/300 sccm, the processing pressure of about 0.7 Pascal, and the wafer stage temperature of about 65° C. After the process, the resist film 57 which becomes needless is removed.

Next, as illustrated in FIG. 10, almost entire surface on the device surface 1a of the wafer 1 is covered with the inorganic final passivation film 56. As described above, when the inorganic final passivation film 56 is a two-layer film, the film-forming process includes two stages: the formation of plasma CVD silicon oxide film; and the formation of plasma CVD silicon nitride film. The condition of forming the plasma CVD silicon oxide film is, for example, the gas flow rate ratio $SiH_4/N_2$ of about 0.5/10, the processing pressure of about 360 Pascal, and the wafer stage temperature of about 400° C. The condition of forming the plasma CVD silicon nitride film is, for example, the gas flow rate ratio $SiH_4/NH_3/N_2$ of about 1.1/0.5/18, the processing pressure of about 600 Pascal, and the wafer stage temperature of about 400° C.

Next, as illustrated in FIG. 11, ordinary lithography is applied to form the bonding pad opening 27 in the inorganic final passivation film 56. The dry etching includes two stages: the continuous dry etching of the silicon nitride film/silicon oxide film (composite inorganic surface protective film); and the etching of titanium nitride film. The condition of dry etching of composite inorganic surface protective film is, for example, the gas flow rate $CF_4/CHF_3/O_2/Ar$ of 150/30/40/650 sccm, the processing pressure of about 27 Pascal, and the wafer stage temperature of about 60° C. The condition of dry etching of titanium nitride film is, for example, the gas flow rate C12/Ar of 30/300 sccm, the processing pressure of about 0.7 Pascal, and the wafer stage temperature of about 65° C.

As in the above cases of each dry etching of barrier metal film 54 as the upper layer, after the treatment of exposing the surface of the aluminum-based metal, there is applied plasma treatment (passivation treatment) in a gas atmosphere containing oxygen as the main component to prevent corrosion of the aluminum-based metal film by the residual halogen. An example of the condition of passivation treatment is, for example, the processing pressure of about 100 Pascal in an oxygen atmosphere, the wafer temperature of about 250° C., and the treatment period of about 2 min. The treatment forms a thin alumina film (aluminum oxide film) on the surface of the aluminum-based metal film 53.

After forming the bonding pad opening 27, if necessary a photosensitive organic final passivation film is coated on almost entire surface of the device surface 1a of the wafer 1, and again a bonding pad opening part is formed by patterning. In this case, the opening part of the photosensitive organic final passivation film is provided in the inorganic final passivation film 56, giving wider opening part than the opening part 27. Furthermore, following the ordinary semiconductor process, there are applied: the wafer probe inspection; the separation process by back grinding, dicing, and the like; the die bonding, wire bonding, and sealing of the wiring substrate 12; the package test; and the final test. Then the product is shipped.

The above description used the auxiliary insulation film 55 as the etching support layer, as an example. The film is, however, not essential. Nevertheless, use of the film can avoid roughening of surface of aluminum-based metal film and other defects.

2. Description of the semiconductor integrated circuit device and the method of manufacturing the same in Embodiment 2 of the present application (mainly FIG. 12 to FIG. 15)

The characteristic of the structure peripheral to the pad according to Embodiment 2 is to form a bonding pad opening and a slit-shape region where the upper layer barrier metal layer is removed, with a space from the bonding pad opening, at the wiring part in the vicinity of each bonding pad part beneath the final passivation film.

According to the example, the slit-shape titanium nitride film removing part exists inside the wiring. However, the slit-shape part may be formed so as to cross the wiring part. When the slit-shape part crosses the wiring part, the propagation route of abnormal oxidation of titanium from the bonding pad toward the I/O circuit region can completely be cut off. However, similar to Section 5, there is a possibility of generation of etching trench and the like in the base insulation film.

The example shows an integral slit. As described in Section 1, however, the slit may be a group of multiple shapes. Nevertheless, an integral slit increases the capacity of shutting off the propagation route of abnormal oxidation of titanium from the bonding pad toward the I/O circuit region.

Figure 12:
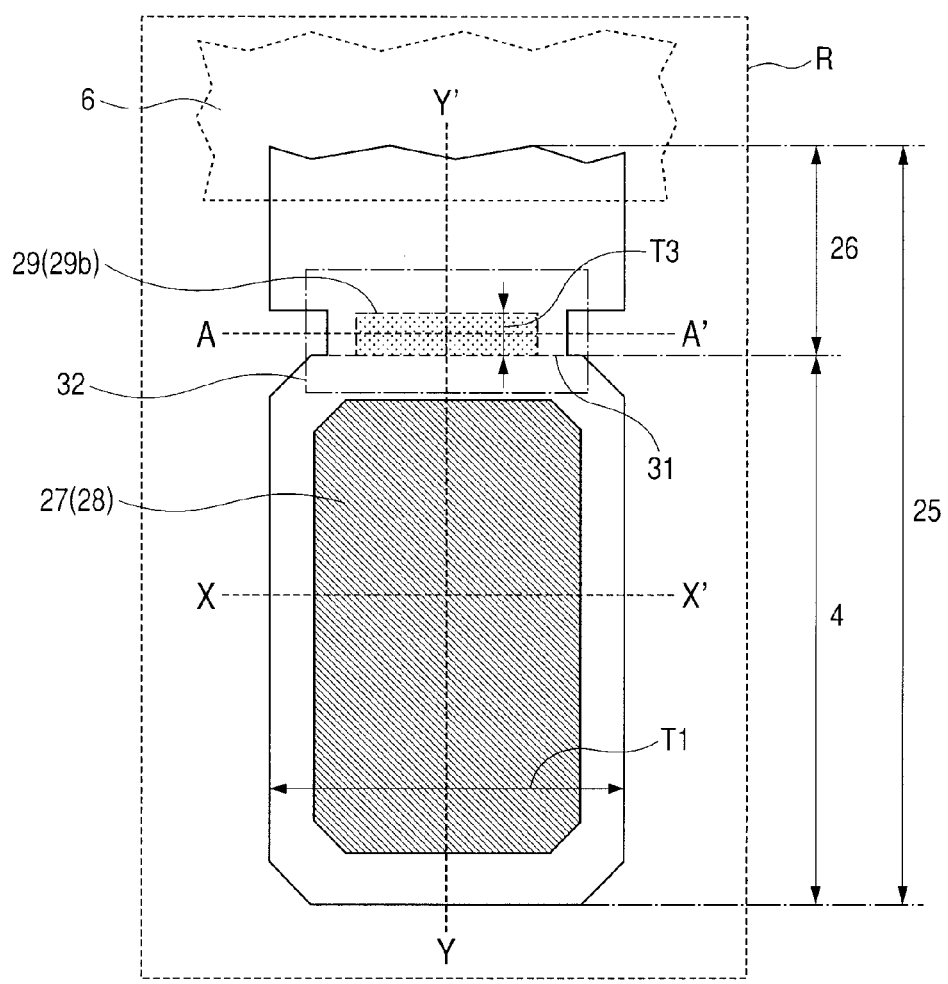
FIG. 12 illustrates an enlarged plan view of peripheral area of the bonding pad part corresponding to the enlarged part R in peripheral area of the pad, in the layout inside the chip (first main surface) of a semiconductor integrated circuit device of Embodiment 2 of the present application.
Figure 13:
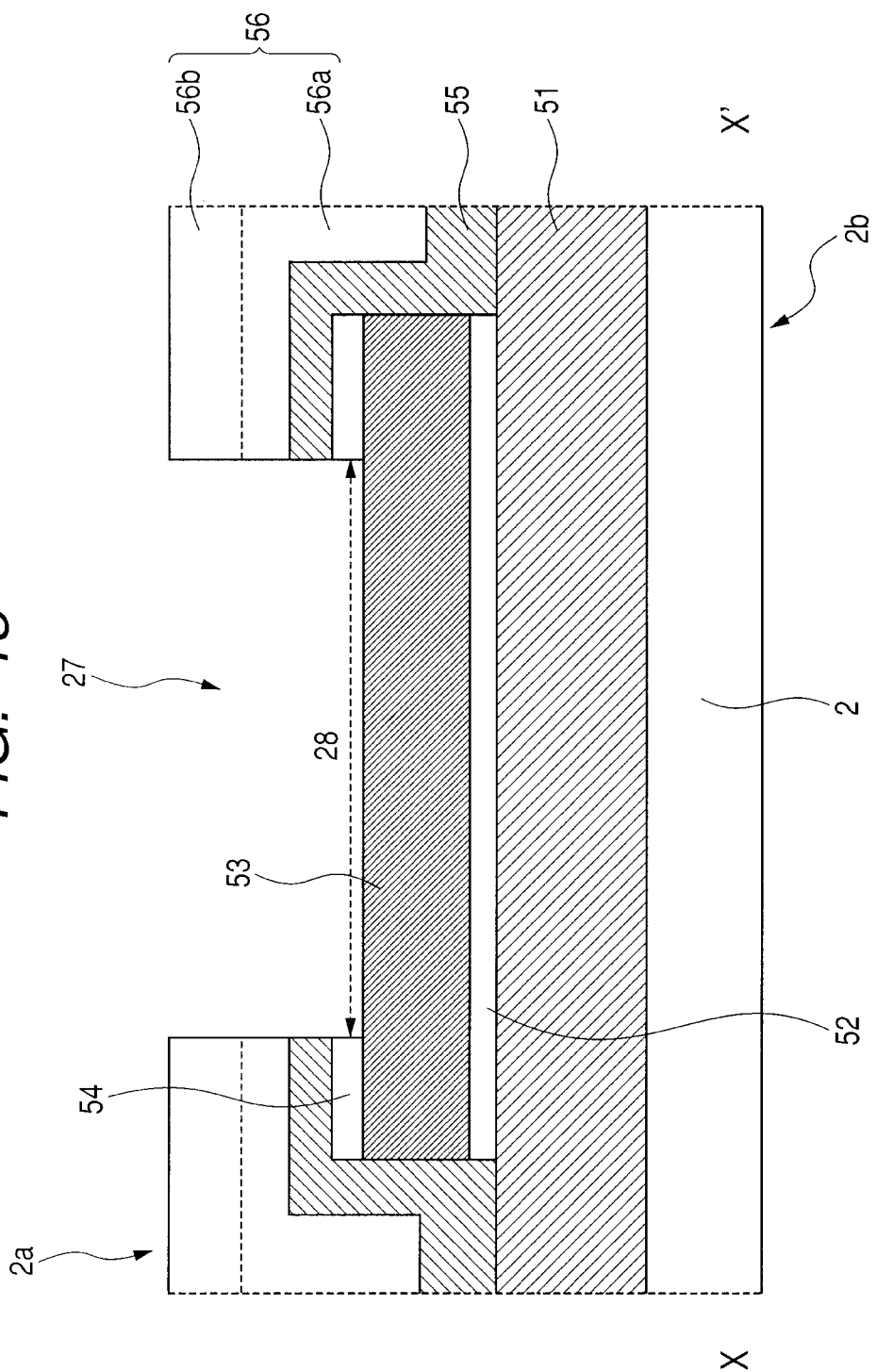
FIG. 13 illustrates a chip cross sectional view of X-X' section in FIG. 12.
Figure 14:
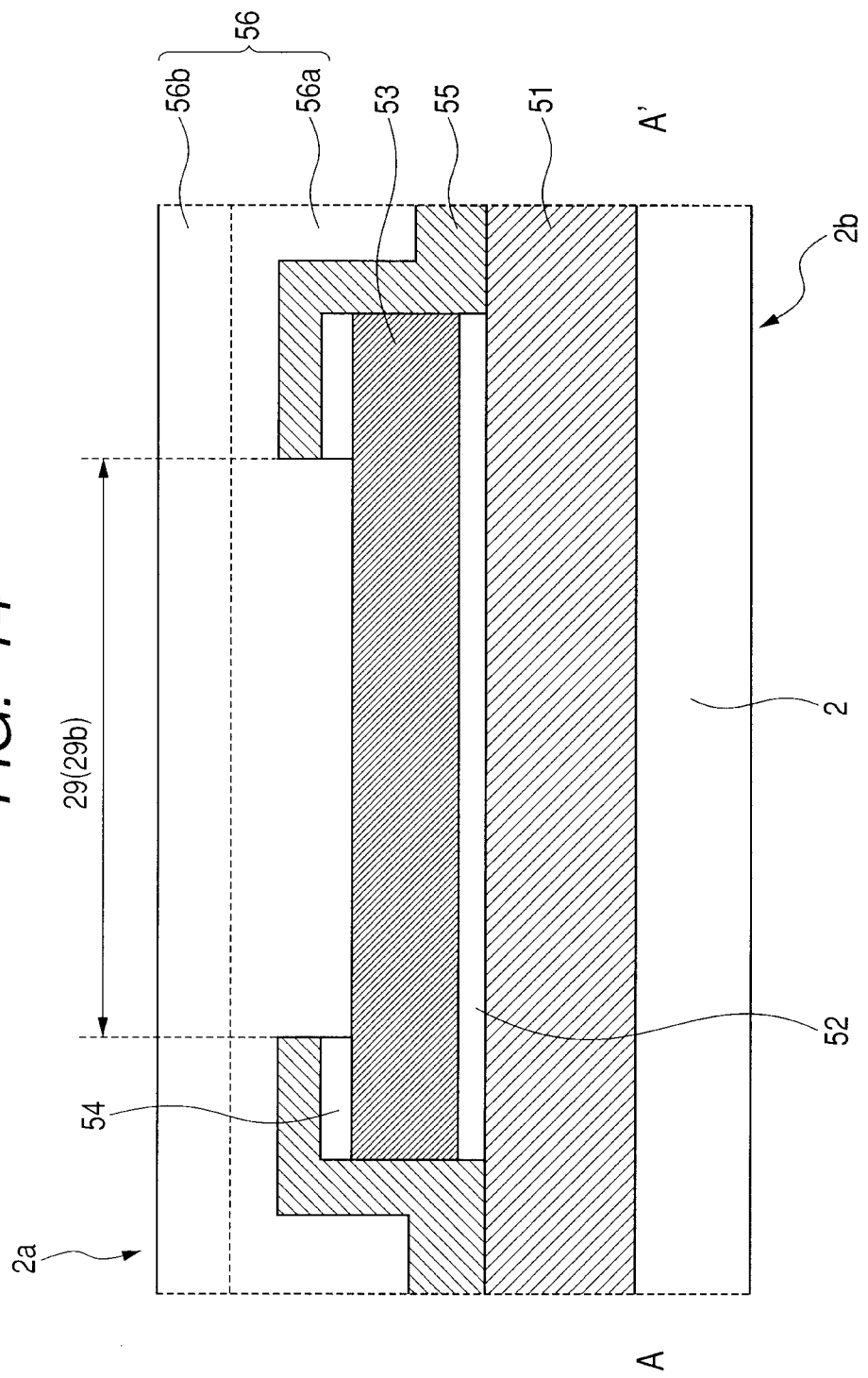
FIG. 14 illustrates a chip cross sectional view of A-A' section in FIG. 12.
Figure 15:
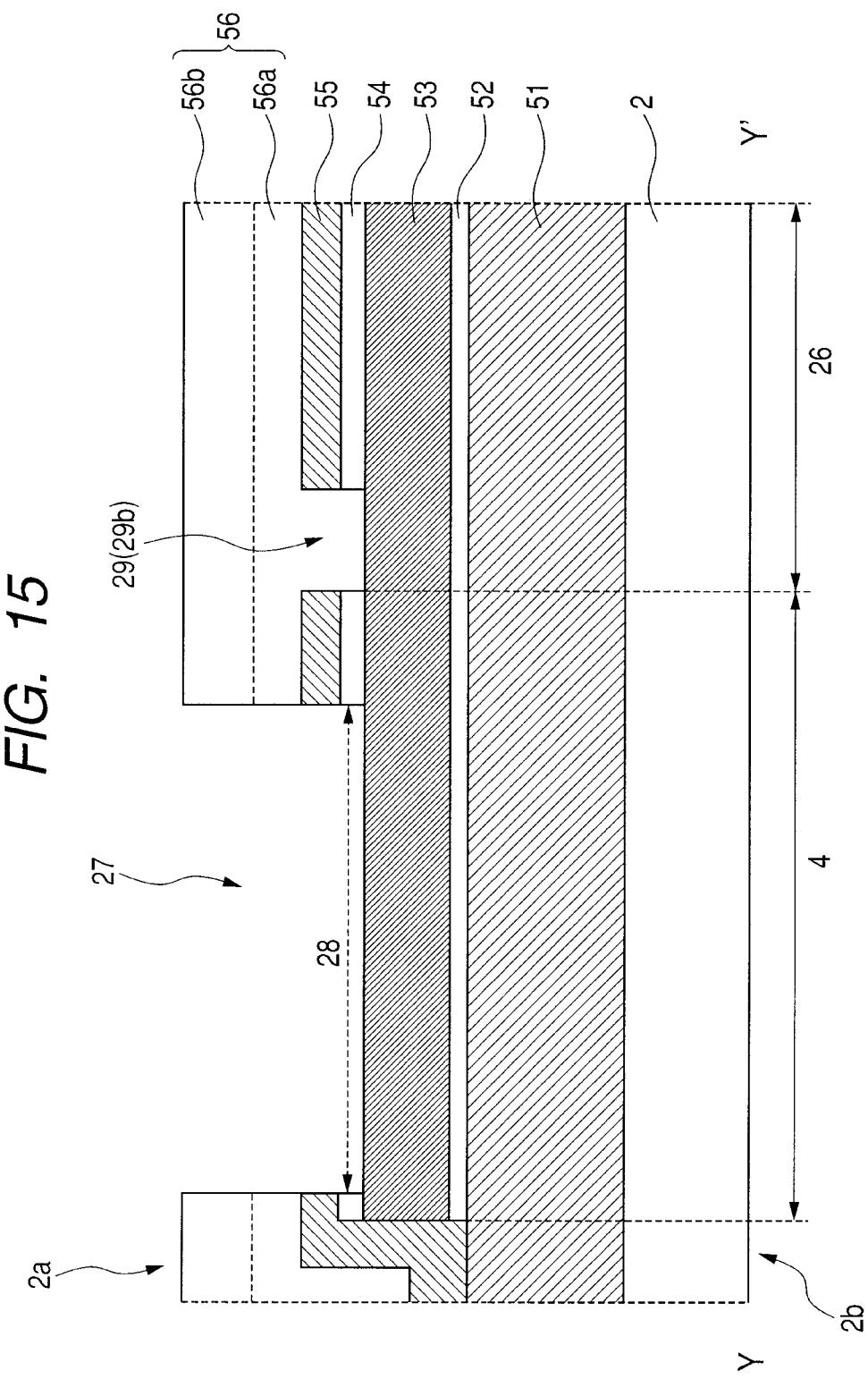
FIG. 15 illustrates a chip cross sectional view of Y-Y' section in FIG. 12.

FIG. 12 illustrates an enlarged plan view of peripheral area of the bonding pad part corresponding to the enlarged part R in peripheral area of the pad, in the layout inside the chip (first main surface) of the semiconductor integrated circuit device of Embodiment 2 of the present application. FIG. 13 illustrates a chip cross sectional view of X-X' section in FIG. 12. FIG. 14 illustrates a chip cross sectional view of A-A' section in FIG. 12. FIG. 15 illustrates a chip cross sectional view of Y-Y' section in FIG. 12.

The example has the characteristic of, as illustrated in FIG. 12, FIG. 14, and FIG. 15, providing the second opening part (titanium nitride film removing part) 29 in the vicinity of the boundary 31 between the bonding pad part of the aluminum-based metal film pattern 25 and the wiring part 26, or as the second titanium nitride film removing part (slit-shape titanium nitride film removing part) 29b in the region 32 in the vicinity of boundary. Accordingly, as illustrated in FIG. 13, X-X' section is the same as the section of ordinary bonding pad. On the other hand, regarding the Y-Y' section and the A-A' section, as illustrated in FIG. 14 and FIG. 15, respectively, the second titanium nitride film removing part (slit-shape titanium nitride film removing part) 29b removes the barrier metal film 54 as the upper layer, and is covered with the inorganic final passivation film 56. In this example, the slit-shape titanium nitride film removing part 29b is provided at the wiring part 26 side of the boundary 31. The slit-shape part 29b may be provided at the bonding pad part 4 side. The advantages of providing the slit-shape titanium nitride film removing part 29b at the wiring part 26 side of the boundary 31 are that the area of the bonding pad part 4 is not consumed and that the growth and enlarge of titanium oxide in the portions toward the I/O circuit region 6 can be effectively prevented with a relatively small area. When the breadth of the wiring part at the portion is about 40 micrometer, since the width T3 of the slit-shape titanium nitride film removing part 29b is about 5 micrometer, the breadth thereof becomes about 35 micrometer. A preferable range of the width T3 of the slit-shape titanium nitride film removing part 29b is, for example, in a range from about 0.3 to about 10 micrometer.

As illustrated in FIG. 14, the embodiment adopts slit shape for the second titanium nitride film removing part 29b. However, the second part 29b may all be removed. That is, although a part of the second titanium nitride film 54 is left at the edge part of the aluminum-based metal film 53, all of the remained second titanium nitride film 54 may be removed along the A-A' section. In that case, at the edge part of the aluminum-based metal film 53, also the auxiliary insulation film 55 is removed, and the inorganic final passivation film 56 is directly formed. With the structure, the propagation route of abnormal oxidation of titanium from the bonding pad toward the I/O circuit region can be more securely cut off.

The manufacturing method is basically the same as that described in Section 1 except for the mask patterning of the opening part 27.

3. Description of the semiconductor integrated circuit device and the method of manufacturing the same in Embodiment 3 of the present application (mainly FIG. 16 and FIG. 17)

The characteristic of the structure peripheral to the pad according to Embodiment 3 is to form both the ring-shape region (Section 1) and the slit-shape region (Section 2) beneath the final passivation film.

Figure 16:
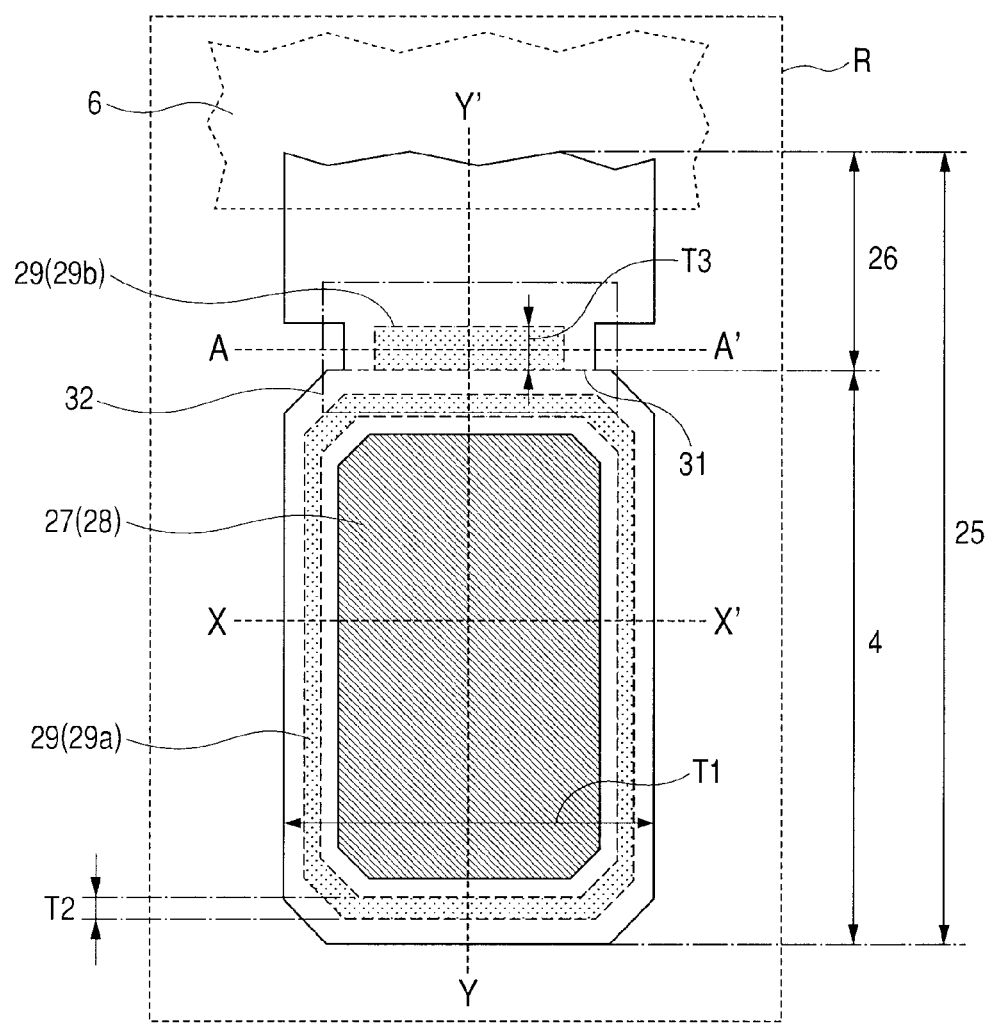
FIG. 16 illustrates an enlarged plan view at peripheral area of the bonding pad part corresponding to the enlarged part R in peripheral area of the pad, in the layout inside the chip (first main surface) of a semiconductor integrated circuit device of Embodiment 3 of the present application.
Figure 17:
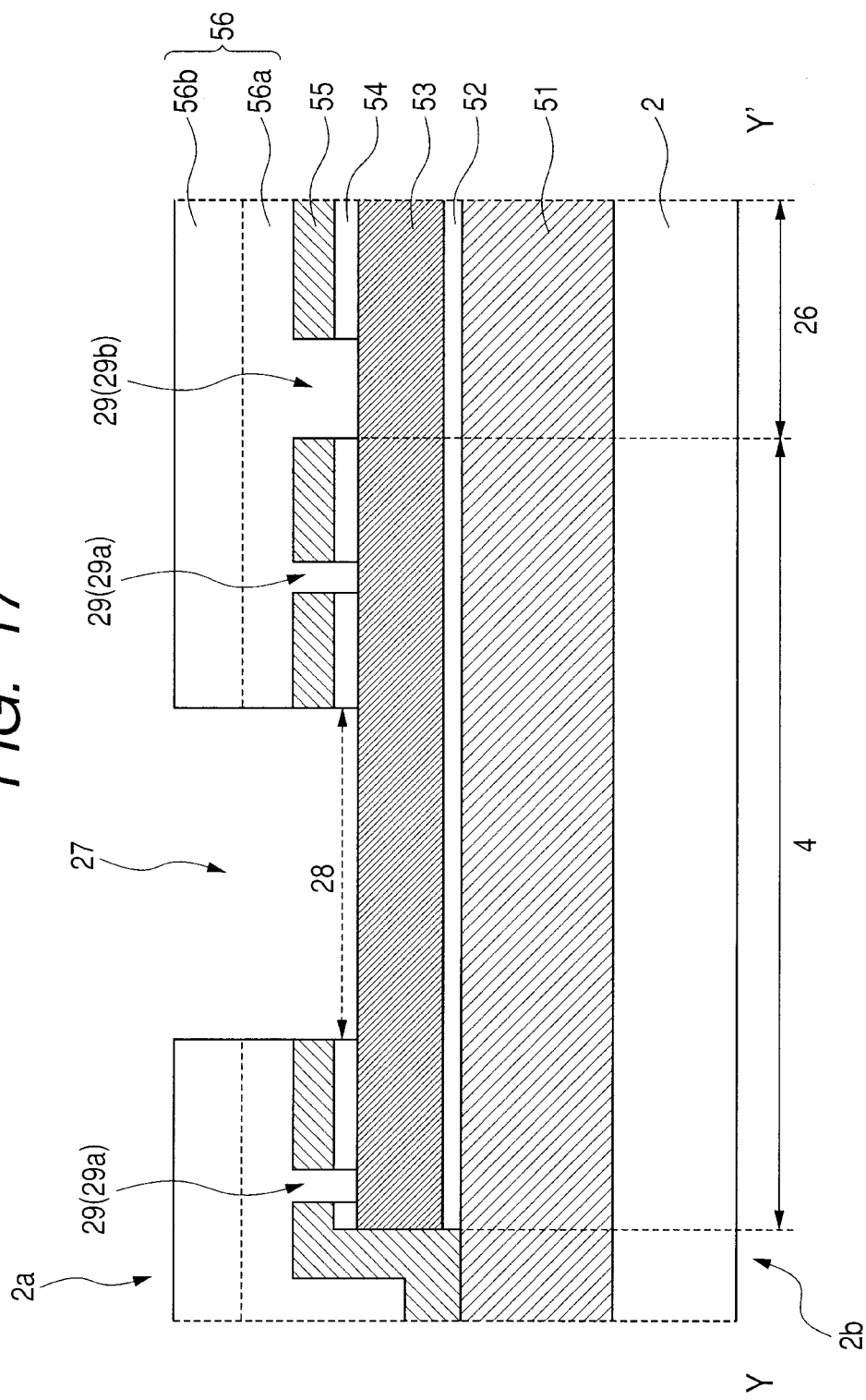
FIG. 17 illustrates a chip cross sectional view of Y-Y' section in FIG. 16.

FIG. 16 illustrates an enlarged plan view at peripheral area of the bonding pad part corresponding to the enlarged part R in peripheral area of the pad, in the layout inside the chip (first main surface) of the semiconductor integrated circuit device of Embodiment 3 of the present application. FIG. 17 illustrates a chip cross sectional view of Y-Y' section in FIG. 16.

In this example, as illustrated in FIG. 16 and FIG. 17, there are formed both the first titanium nitride film removing part (ring-shape titanium nitride film removing part) 29a and the second titanium nitride film removing part (slit-shape titanium nitride film removing part) 29b. Accordingly, the titanium oxide film being formed at peripheral area of the bonding pad opening 27 (first opening part 28) is effectively prevented from growing toward the I/O circuit region 6 which is sensitive to that kind of abnormal part.

The dimensions and the position of the ring-shape titanium nitride film removing part 29a and the second titanium nitride film removing part (slit-shape titanium nitride film removing part) 29b are the same as those of Section 1 or Section 2.

Regarding the slit-shape titanium nitride film removing part 29b, similar to Embodiment 3, all the second titanium nitride film 54 and the auxiliary insulation film 55 at the edge part of the aluminum-based metal film 53 may be removed along the A-A' section.

The manufacturing method is basically the same as that described in Section 1 except for the mask pattern of the opening part 27.

4. Description of the semiconductor integrated circuit device and the method of manufacturing the same in Embodiment 4 of the present application (mainly FIG. 18 to FIG. 22)

The characteristic of the structure peripheral to the pad according to Embodiment 4 is to establish a structure for easy manufacture by removing the final passivation film above the ring-shape region (Section 1), the slit-shape region (Section 2), and the like.

Figure 18:
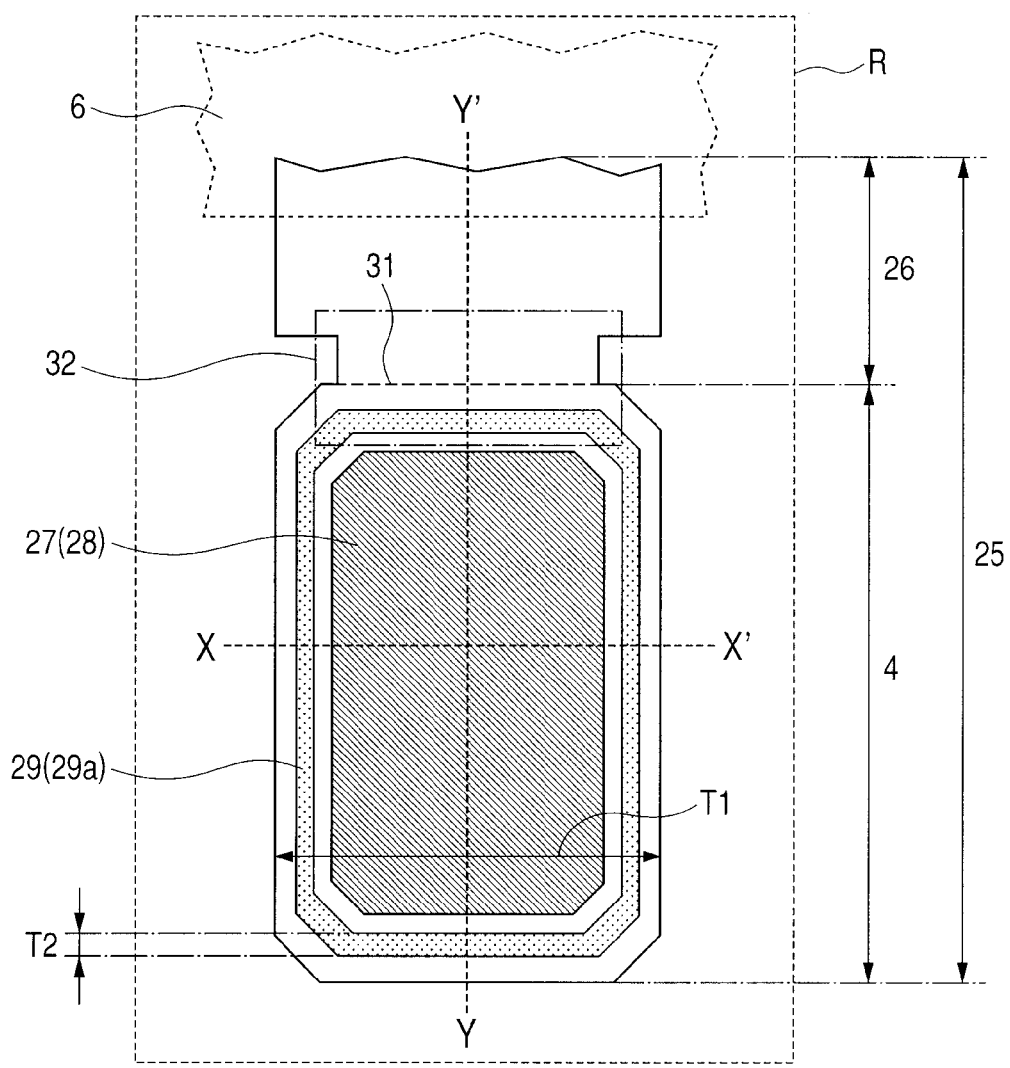
FIG. 18 illustrates an enlarged plan view of peripheral area of the bonding pad part corresponding to the enlarged part R in peripheral area of the pad, in the layout inside the chip (first main surface) of a semiconductor integrated circuit device of Embodiment 4 of the present application.
Figure 19:
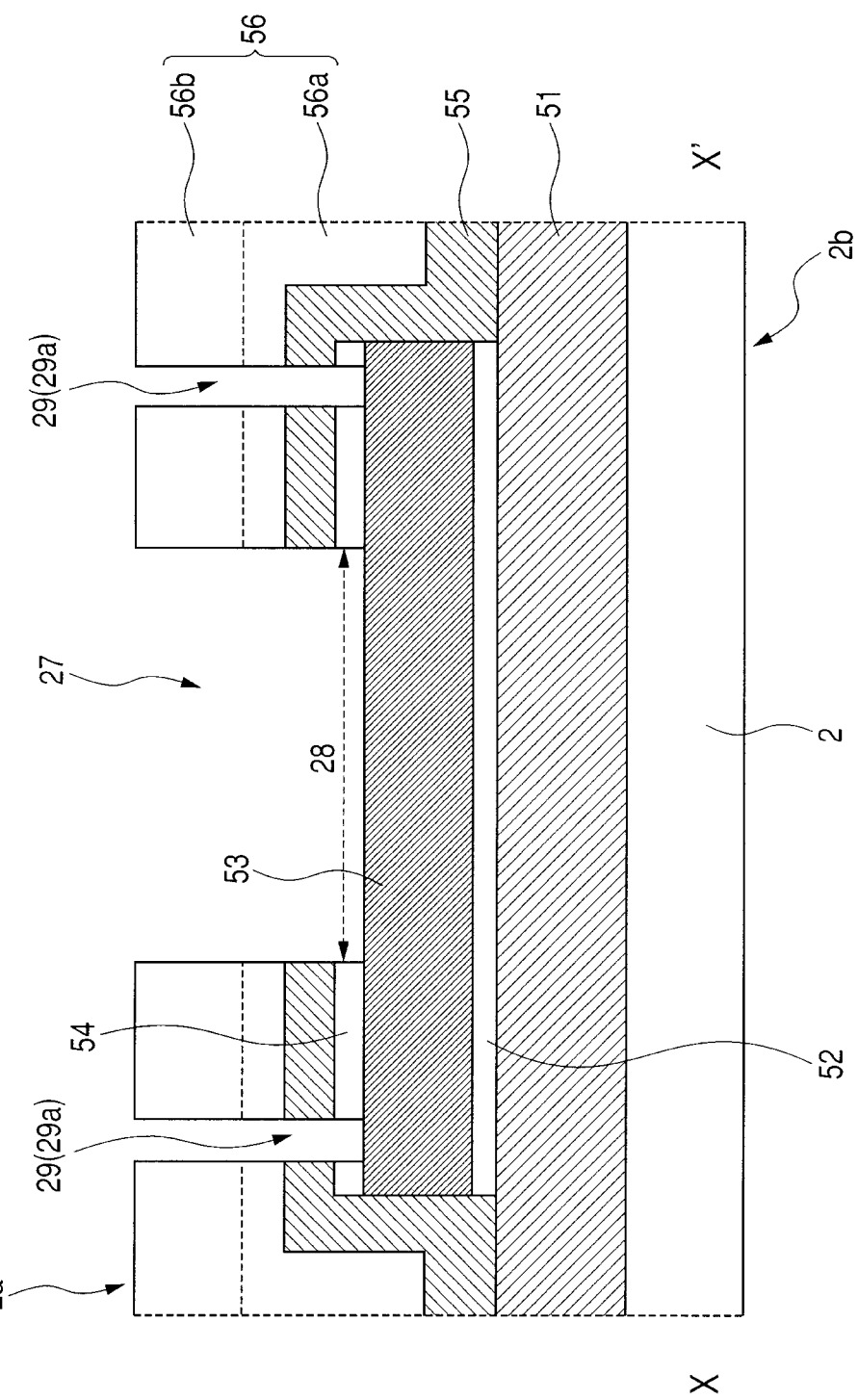
FIG. 19 illustrates a chip cross sectional view of X-X' section in FIG. 18.
Figure 20:
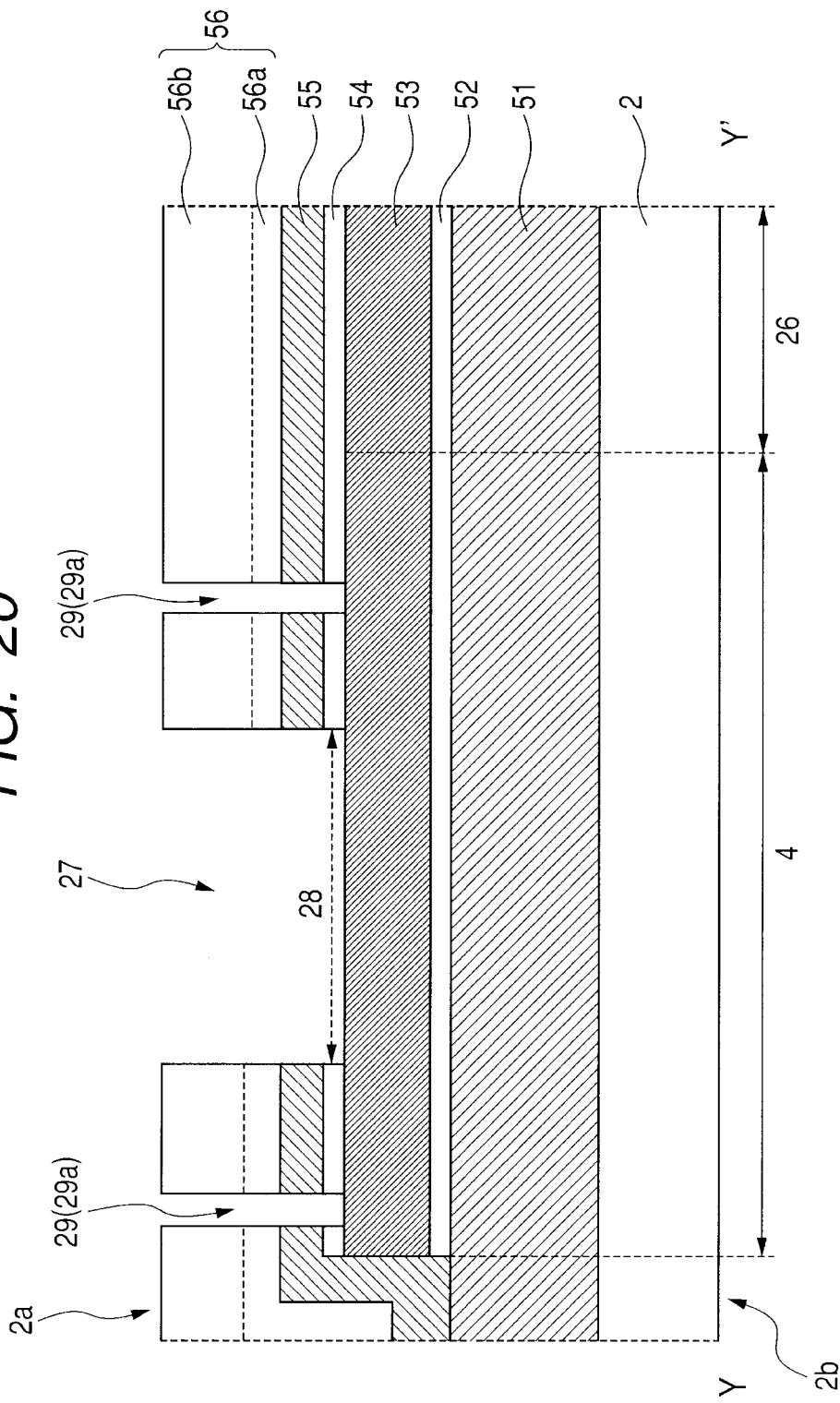
FIG. 20 illustrates a chip cross sectional view of Y-Y' section in FIG. 18.

FIG. 18 illustrates an enlarged plan view of peripheral area of the bonding pad part corresponding to the enlarged part R in peripheral area of the pad, in the layout inside the chip (first main surface) of the semiconductor integrated circuit device of Embodiment 4 of the present application. FIG. 19 illustrates a chip cross sectional view of X-X' section in FIG. 18. FIG. 20 illustrates a chip cross sectional view of Y-Y' section in FIG. 18.

As illustrated in FIG. 18, FIG. 19, and FIG. 20, the structural characteristic is the absence of the inorganic insulation surface protective film 56 above the first titanium nitride film removing part (ring-shape titanium nitride film removing part) 29a. Even without the inorganic insulation surface protective film 56, the surface of the aluminum-based metal film 53 at that portion is passivation-treated, and is covered with a thin alumina film with several nanometers of thickness, and thus the portion is not corroded under normal condition. To improve the resistance to humidity, however, it is preferable to cover the upper surface 2a of the chip 2 with an organic final passivation film, as described before.

Embodiment 4 shows an example of providing only the ring-shape titanium nitride film removing part 29a. Adding to the ring-shape part, or instead of the ring-shape part, the slit-shape titanium nitride film removing part 29b may be provided. Furthermore, as for the slit-shape titanium nitride film removing part 29b, similar to Embodiment 3, all the second titanium nitride film 54 and the auxiliary insulation film 55 at the edge part of the aluminum-based metal film 53 may be removed along the A-A' section.

The dimensions and the position of the titanium nitride film removing part 29, or the ring-shape titanium nitride film removing part 29a and the second titanium nitride film removing part (slit-shape titanium nitride film removing part) 29b are the same as those of Sections 1, 2 or 3.

Figure 21:
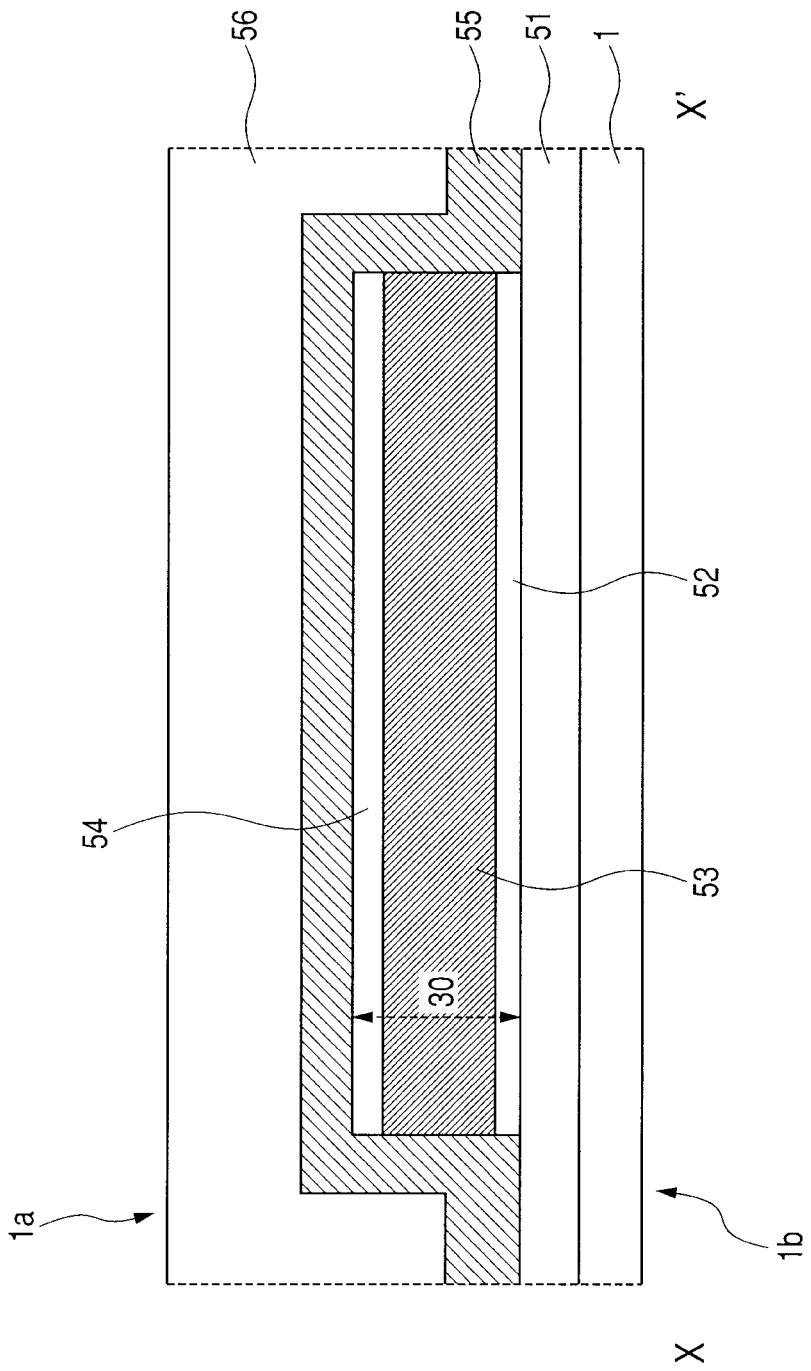
FIG. 21 illustrates a device cross sectional flow diagram (step of forming an insulation surface protective film) corresponding to X-X' section in FIG. 18 in the method of manufacturing a semiconductor integrated circuit device of Embodiment 4 of the present application.
Figure 22:
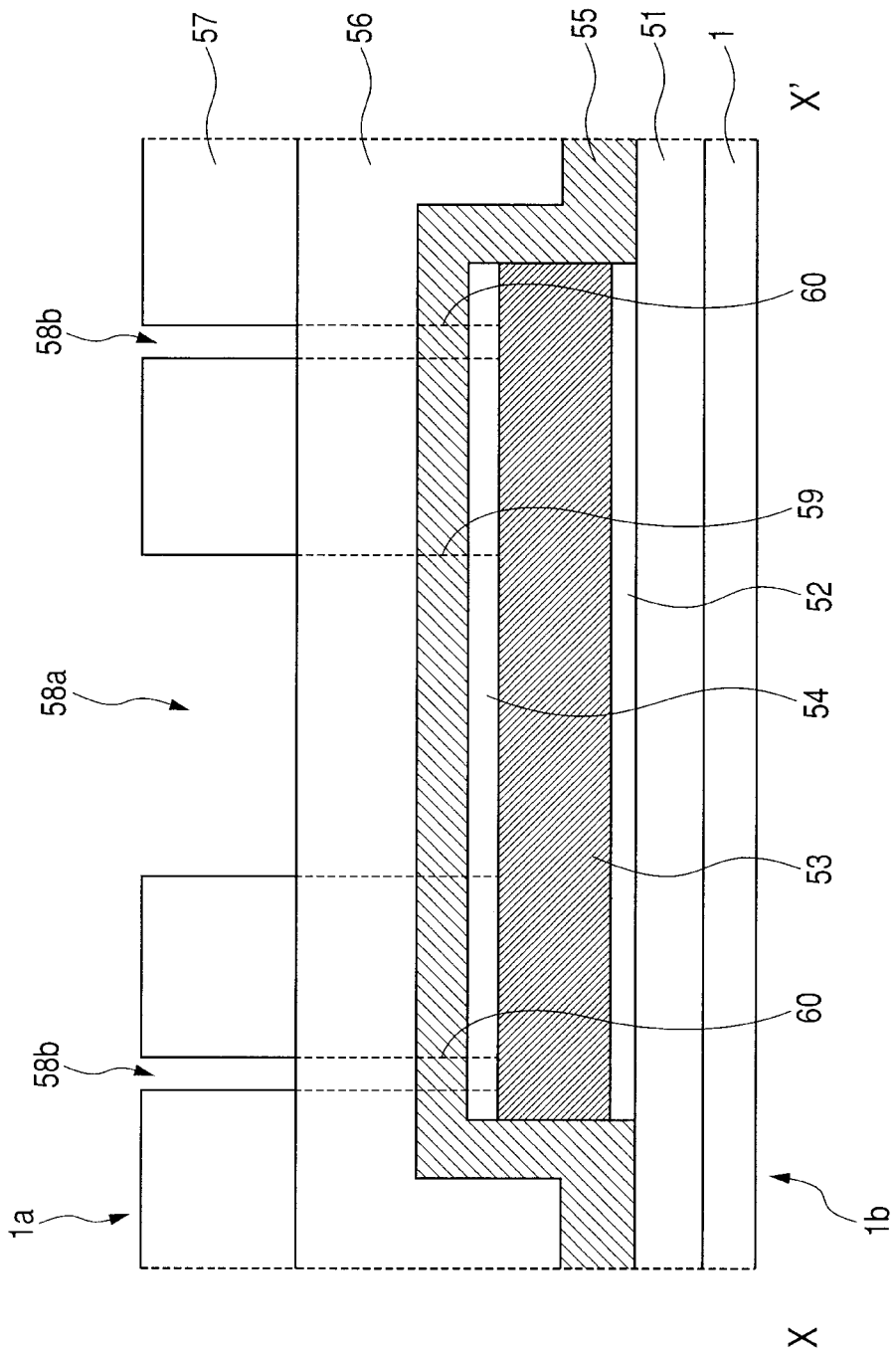
FIG. 22 illustrates a device cross sectional flow diagram (step of forming a resist film for patterning a titanium nitride film removing part and a pad opening) corresponding to X-X' section in FIG. 18 in the method of manufacturing a semiconductor integrated circuit device of Embodiment 4 of the present application.

FIG. 21 illustrates a device cross sectional flow diagram (step of forming an insulation surface protective film) corresponding to X-X' section in FIG. 18 in the method of manufacturing a semiconductor integrated circuit device of Embodiment 4 of the present application. FIG. 22 illustrates a device cross sectional flow diagram (step of forming a resist film for patterning a titanium nitride film removing part and a pad opening) corresponding to X-X' section in FIG. 18 in the method of manufacturing a semiconductor integrated circuit device of Embodiment 4 of the present application. Regarding the manufacturing method, only the portion different from Section 1 is described.

The processing of FIG. 8 and FIG. 9 are skipped, and the steps proceed directly from FIG. 7 to FIG. 21 (corresponding to FIG. 10), forming the inorganic insulation surface protective film 56 (assuming the laminated film similar to Section 1).

Then, as illustrated in FIG. 22, in the resist film 57 for forming the bonding pad opening 27, there are formed an opening 58a for forming bonding pad opening and an opening 58b for forming ring-shape titanium nitride film removing part by ordinary lithography. After that, using the resist film 57 provided with those openings 58a and 58b as the mask, there are formed openings 59 and 60, in relation to the broken line portions, penetrating thorough the inorganic insulation surface protective film 56 (silicon nitride film/silicon oxide film), the auxiliary insulation film 55, and the barrier metal film 54 as the upper layer by dry etching. The dry etching process includes the step of etching the inorganic insulation surface protective film 56 and the auxiliary insulation film 55, and the step of etching the barrier metal film 54 as the upper layer. The condition of dry etching of the step of etching the inorganic insulation surface protective film 56 and the auxiliary insulation film 55 is, for example, the gas flow rate $CF_4/CHF_3/O_2/Ar$ of 150/30/40/650 sccm, the processing pressure of about 27 Pascal, and the wafer stage temperature of about 60° C. The condition of dry etching of the step of etching the barrier metal film 54 as the upper layer is, for example, the gas flow rate C12/Ar of 30/300 sccm, the processing pressure of about 0.7 Pascal, and the wafer stage temperature of about 65° C.

5. Description of the semiconductor integrated circuit device and the method of manufacturing the same in Embodiment 5 of the present application (mainly FIG. 23 to FIG. 30)

The example is effective for the case that the structure for preventing enlargement and growth of the titanium oxide region such as the structure of Sections 1 to 4 is not sufficient, and the characteristic of the example is to eliminate the barrier metal film 54 as the upper layer of entire surface of the bonding pad part 4.

Figure 23:
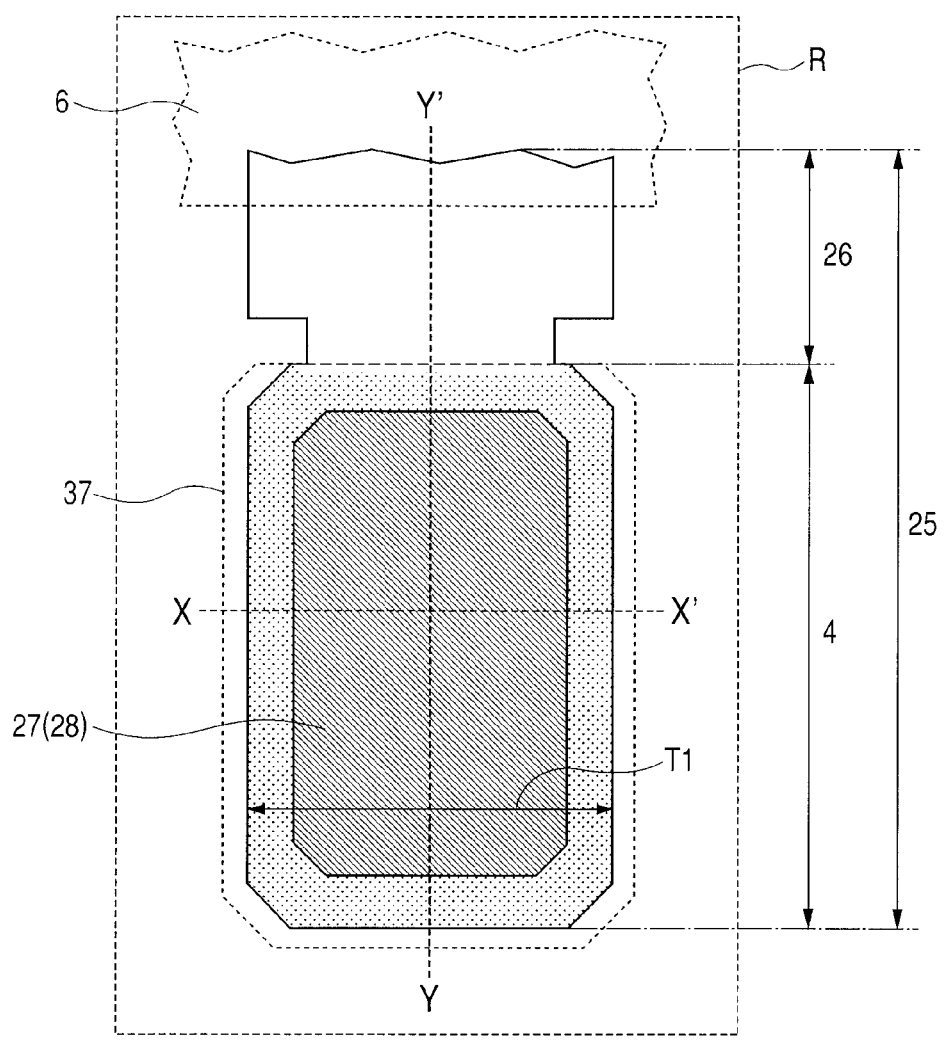
FIG. 23 illustrates an enlarged plan view of peripheral area of the bonding pad part corresponding to the enlarged part R in peripheral area of the pad, in the layout inside the chip (first main surface) of a semiconductor integrated circuit device of Embodiment 5 of the present application.
Figure 24:
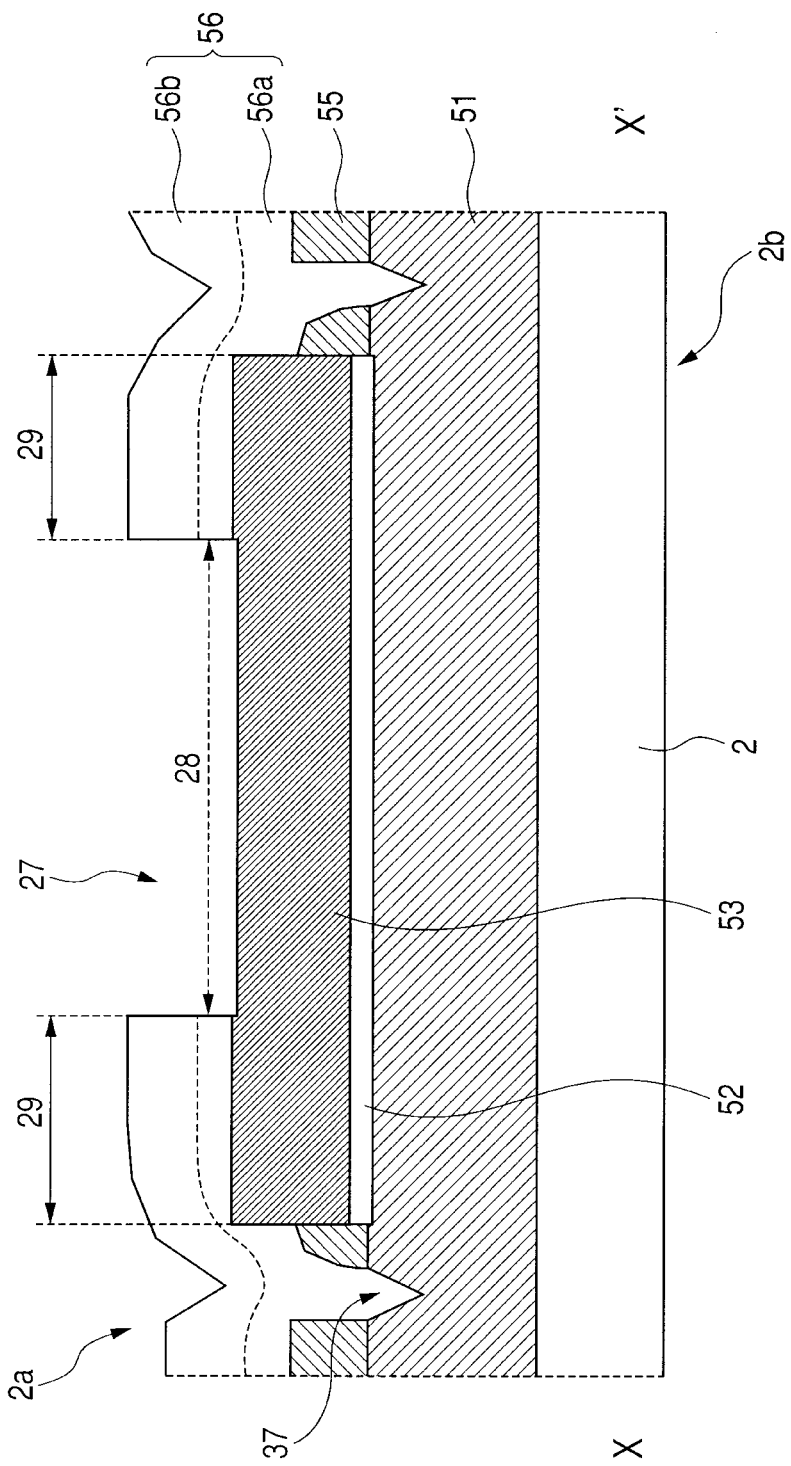
FIG. 24 illustrates a chip cross sectional view of X-X' in FIG. 23.
Figure 25:
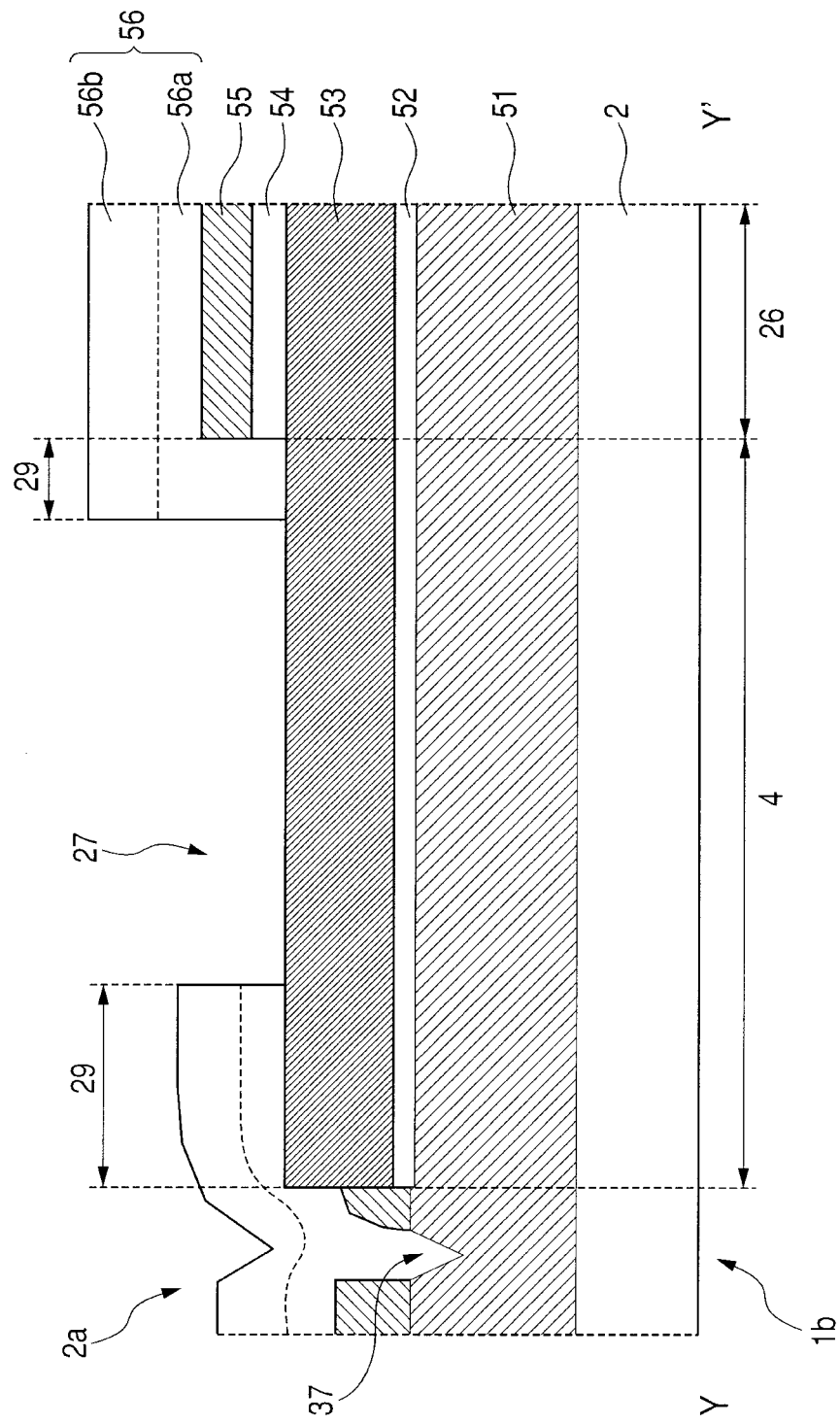
FIG. 25 illustrates a chip cross sectional view of Y-Y' section in FIG. 23.

FIG. 23 illustrates an enlarged plan view of peripheral area of the bonding pad part corresponding to the enlarged part R in peripheral area of the pad, in the layout inside the chip (first main surface) of the semiconductor integrated circuit device of Embodiment 5 of the present application. FIG. 24 illustrates a chip cross sectional view of X-X' section in FIG. 23. FIG. 25 illustrates a chip cross sectional view of Y-Y' section in FIG. 23.

As illustrated in FIG. 23, the example is similar to the ordinary bonding pad and peripheral area thereof in plane. However, the characteristic of the example is the existence of an etching trench 37 at externally surrounding area of the bonding pad part 4. However, the trench is generated on removing the barrier metal film 54 as the upper layer, and the trench is not an essential element. The structural characteristic of the example is that the second opening part 29 is coupled to the first opening part 28 at entire periphery thereof.

As illustrated in FIG. 25, the wiring part 26 is overlaid with the barrier metal film 54 as the upper layer similar to the ordinary wiring structure, thus providing an advantage of attaining the effect by modifying only the bonding pad part 4. Furthermore, since no complex structure is introduced to the bonding pad part 4, the area of the bonding pad opening 27 can be effectively secured.

According to the example, the sole requirement is that the second opening part (titanium nitride film removing part) 29 be coupled to the entire periphery of the bonding pad opening 27 of the bonding pad part 4. Accordingly, it is not necessary to remove the barrier metal film 54 as the upper layer in entire area of the bonding pad part 4. Nevertheless, removal of the barrier metal film 54 as the upper layer at entire area of the bonding pad part 4 is advantageous from the point of effective use of the pad part, and the reliability improves. The second opening part (titanium nitride film removing part) 29 may be extended to the wiring part 26.

Figure 26:
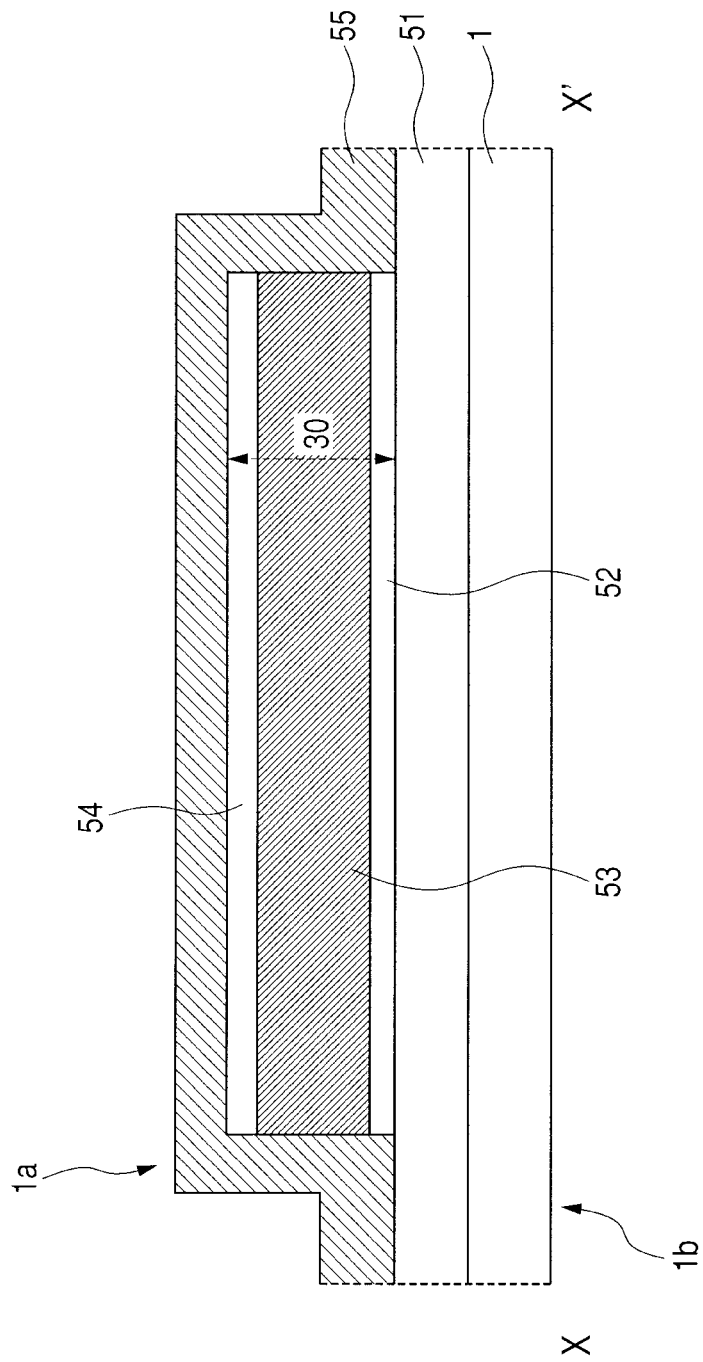
FIG. 26 illustrates a device cross sectional flow diagram (step of forming an auxiliary insulation film) corresponding to X-X' section in FIG. 23 in the method of manufacturing a semiconductor integrated circuit device of Embodiment 5 of the present application.
Figure 27:
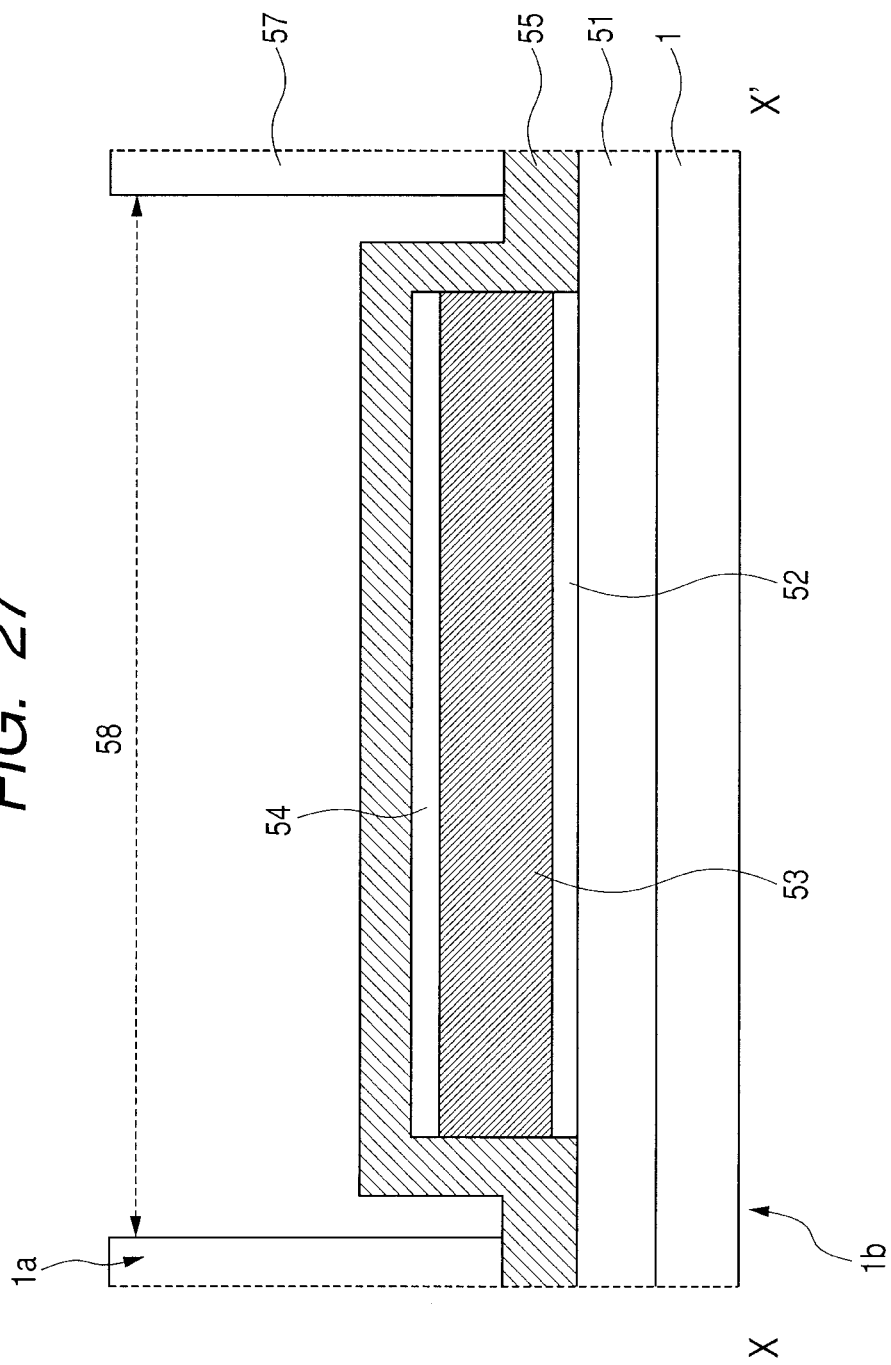
FIG. 27 illustrates a device cross sectional flow diagram (step of forming a resist film for patterning a titanium nitride film removing part) corresponding to X-X' section in FIG. 23 in the method of manufacturing the semiconductor integrated circuit device of Embodiment 5 of the present application.
Figure 28:
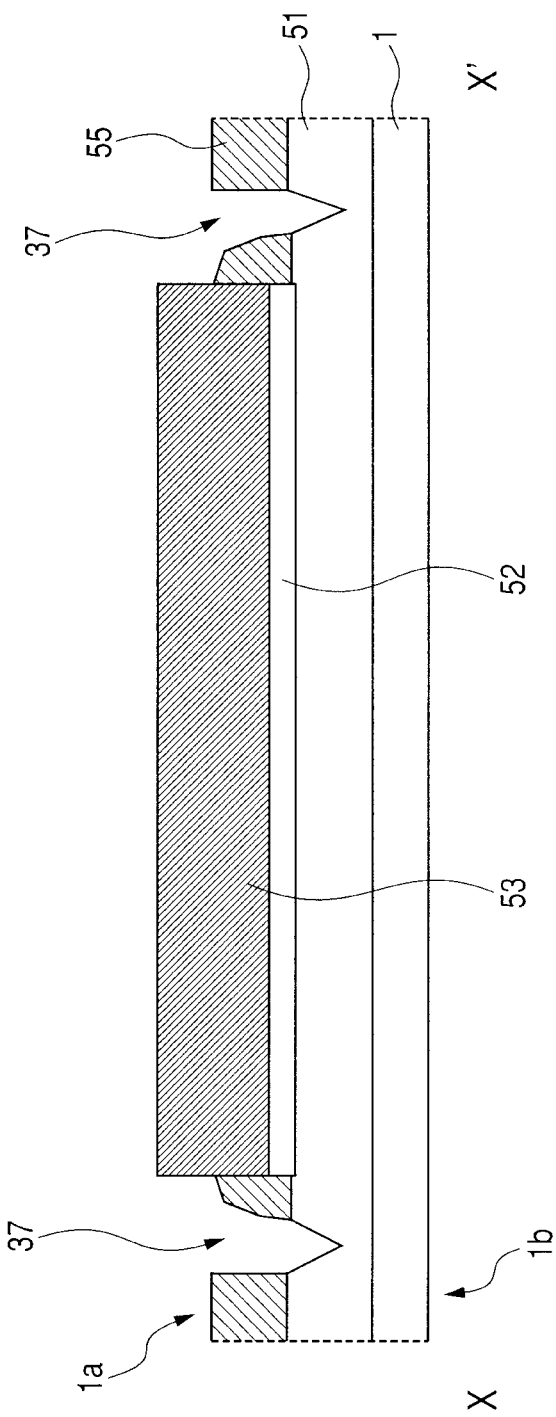
FIG. 28 illustrates a device cross sectional flow diagram (step of forming a titanium nitride film removing part) corresponding to X-X' section in FIG. 23 in the method of manufacturing the semiconductor integrated circuit device of Embodiment 5 of the present application.
Figure 29:
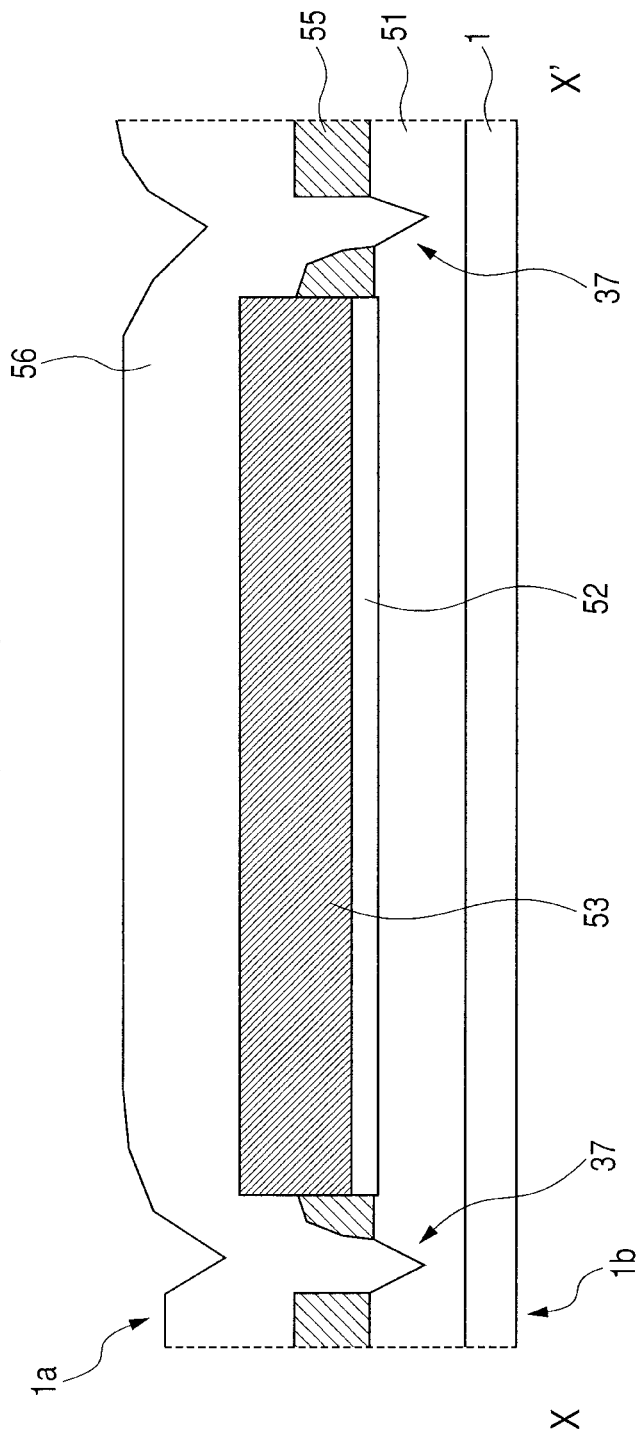
FIG. 29 illustrates a device cross sectional flow diagram (step of forming an insulation surface protective film) corresponding to X-X' section in FIG. 23 in the method of manufacturing the semiconductor integrated circuit device of Embodiment 5 of the present application.
Figure 30:
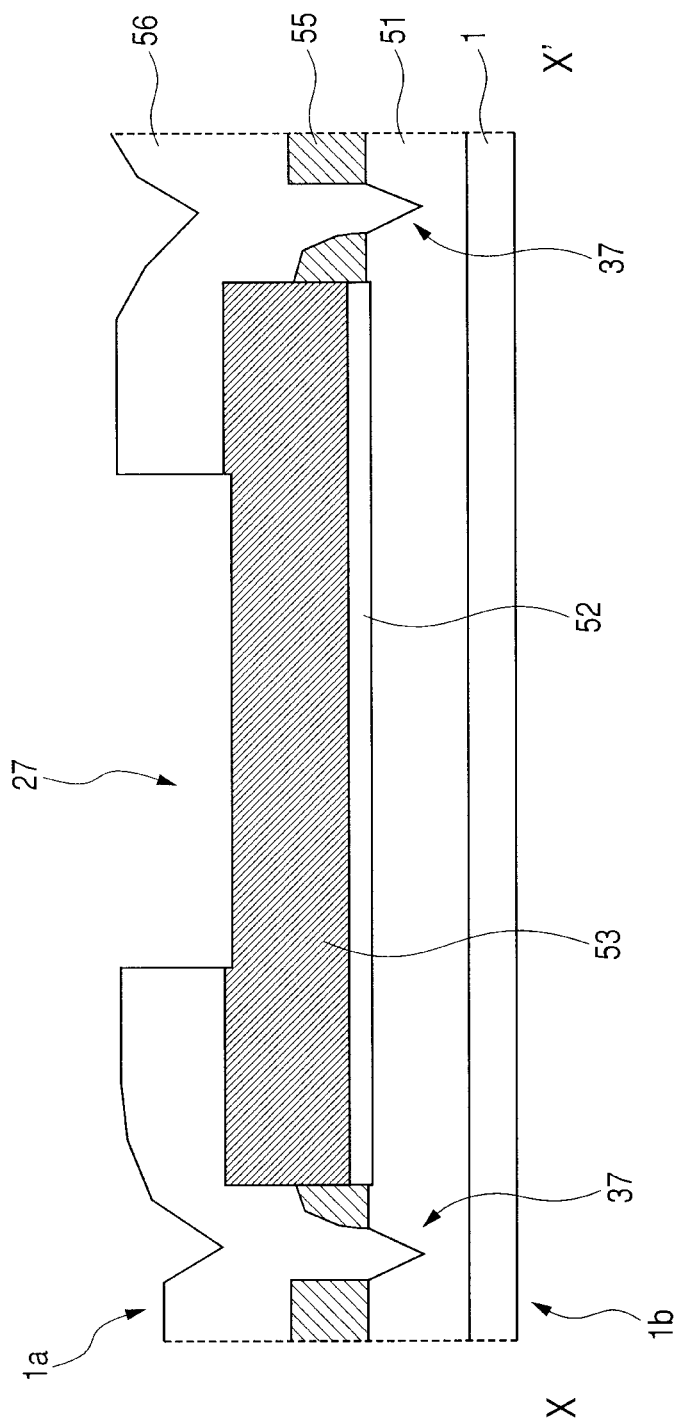
FIG. 30 illustrates a device cross sectional flow diagram (step of forming a pad opening) corresponding to X-X' section in FIG. 23 in the method of manufacturing the semiconductor integrated circuit device of Embodiment 5 of the present application.

FIG. 26 illustrates a device cross sectional flow diagram (step of forming an auxiliary insulation film) corresponding to X-X' section in FIG. 23 in the method of manufacturing a semiconductor integrated circuit device of Embodiment 5 of the present application. FIG. 27 illustrates a device cross sectional flow diagram (step of forming a resist film for patterning a titanium nitride film removing part) corresponding to X-X' section in FIG. 23 in the method of manufacturing a semiconductor integrated circuit device of Embodiment 5 of the present application. FIG. 28 illustrates a device cross sectional flow diagram (step of forming a titanium nitride film removing part) corresponding to X-X' section in FIG. 23 in the method of manufacturing a semiconductor integrated circuit device of Embodiment 5 of the present application. FIG. 29 illustrates a device cross sectional flow diagram (step of forming an insulation surface protective film) corresponding to X-X' section in FIG. 23 in the method of manufacturing a semiconductor integrated circuit device of Embodiment 5 of the present application. FIG. 30 illustrates a device cross sectional flow diagram (step of forming a pad opening) corresponding to X-X' section in FIG. 23 in the method of manufacturing a semiconductor integrated circuit device of Embodiment 5 of the present application. Regarding the manufacturing method, only the portion different from Section 1 is described.

FIG. 26 is the same as FIG. 7, and the previous processes are the same as those in Section 1.

As illustrated in FIG. 27, there is formed the resist film 57 having the opening part 58 which has slightly wider area than that of the bonding pad part 4 by ordinary lithography.

Then, as illustrated in FIG. 28, the resist film 57 is used as the mask to remove the auxiliary insulation film 55 and the barrier metal film 54 as the upper layer by the dry etching. The step forms the etching trench 37 in the uppermost layer of the multilayer wiring layer 51, or in the interlayer insulation film (silicon oxide-based insulation film) of the tungsten-via layer. The condition of dry etching of the auxiliary insulation film 55 is, for example, the gas flow rate $CF_4/CHF_3/O_2/Ar$ of 150/30/40/650 sccm, the processing pressure of about 27 Pascal, and the wafer stage temperature of about 60° C. The condition of dry etching of the step of dry etching the barrier metal film 54 as the upper layer is, for example, the gas flow rate C12/Ar of 30/300 sccm, the processing pressure of about 0.7 Pascal, and the wafer stage temperature of about 65° C. After the treatment, passivation treatment is required as described before.

Next, as illustrated in FIG. 29, almost entire area of the surface of the device surface 1a of the wafer 1 is covered with the inorganic final passivation film 56. The process is the same as that in Section 1.

Then, as illustrated in FIG. 30, ordinary lithography is applied to form the bonding pad opening 27 in the inorganic final passivation film 56. In this case, since the auxiliary insulation film 55 and the barrier metal film 54 as the upper layer beneath the bonding pad opening 27 of the inorganic final passivation film 56 have already been removed, there is no need to remove them in the step. Accordingly, the process is the dry etching process only for the silicon nitride film/silicon oxide film (inorganic laminated final passivation film). The condition of dry etching of the inorganic laminated final passivation film is, for example, the gas flow rate $CF_4/CHF_3/O_2/Ar$ of 150/30/40/650 sccm, the processing pressure of about 27 Pascal, and the wafer stage temperature of about 60° C.

6. Summary

While the invention perfected by the inventors of the present application has been described in detail with reference to specific embodiments, it will be apparent that the present invention is not limited to the embodiments and that various changes and modifications can be made therein without departing from the spirit and scope thereof.

For example, the above embodiments give detail description of the multilayer wiring layer using a copper-based damascene wiring (buried wiring). The present invention is not limited to that copper-based damascene wiring, and naturally the present invention can be applied to silver-based or tungsten-based damascene wiring (buried wiring), or aluminum-based non-buried wiring.

What is claimed is:

1. A method of manufacturing a semiconductor integrated circuit device comprising the steps of:
(a) forming a metal composite film pattern by patterning a metal composite film containing a lower layer barrier metal film, a middle layer aluminum-based metal film, and an upper layer barrier metal film, which are formed over a multilayer wiring layer over a device surface of a semiconductor wafer;
(b) forming an insulation surface protective film over almost entire surface of the device surface of the semiconductor wafer including the upper surface of the metal composite film pattern;
(c) after the step (b) and before the step (d), forming a bonding pad opening in the insulation surface protective film;
(d) forming a first opening part at a portion corresponding to the bonding pad opening of the upper layer barrier metal film; and
(e) forming a second opening part in the upper layer barrier metal film in the vicinity of the first opening part, wherein the width of the first opening part is larger than that of the second opening part.

2. The method of manufacturing a semiconductor integrated circuit device according to claim 1, wherein the step (e) is executed before the steps (b) and (d).

3. The method of manufacturing semiconductor integrated circuit device according to claim 1, wherein the steps (d) and (e) are executed at nearly the same time after the steps (b) and (c).

4. The method of manufacturing a semiconductor integrated circuit device according to claim 1, wherein the insulation surface protective film is a laminated film containing a silicon oxide-based film as a lower layer and a silicon nitride-based film as an upper layer.

5. The method of manufacturing a semiconductor integrated circuit device according to claim 3, wherein the steps (d) and (e) are executed by continuous processing of the insulation surface protective film and the upper layer barrier metal film using the same etching mask.

6. The method of manufacturing a semiconductor integrated circuit device according to claim 1, wherein the width of the second opening part is in a range from 0.3 to 10 micrometer.

7. The method of manufacturing a semiconductor integrated circuit device according to claim 1, wherein the second opening part is formed in a ring shape so as to surround the first opening part.

8. The method of manufacturing a semiconductor integrated circuit device according to claim 1, wherein: the metal composite film pattern has a bonding pad part containing the first opening part therein and a wiring part coupled thereto; and the second opening part is formed in the vicinity of a boundary between the bonding pad part and the wiring part.

9. The method of manufacturing a semiconductor integrated circuit device according to claim 1, further comprising the step of (f) after the steps (a), (d) and (e), applying a passivation treatment to an exposed surface portion of the middle layer aluminum-based metal film.

10. The method of manufacturing a semiconductor integrated circuit device according to claim 1, further comprising the step of (g) after the steps (a) to (e), executing wafer probe inspection by letting a probe needle contact with the surface of the middle layer aluminum-based metal film at the first opening part, and breaking a passivation film over the surface thereof to establish contact.

11. The method of manufacturing a semiconductor integrated circuit device according to claim 10, further comprising the step of (h) after the step (g), sealing the upper surface of the metal composite film with a halogen-free resin.

12. The method of manufacturing a semiconductor integrated circuit device according to claim 1, wherein the first opening part is spaced from the second opening part in plan view.

13. A method of manufacturing a semiconductor integrated circuit device comprising the steps of:
(a) forming an aluminum-based metal film over a first insulation film over a first main surface of a semiconductor wafer;
(b) forming a titanium nitride film over the aluminum-based metal film;
(c) forming a composite film pattern which becomes a plurality of bonding pads by patterning a composite film containing the aluminum-based metal film and the titanium nitride film;
(d) exposing an upper surface of each of the bonding pads by removing the titanium nitride film from the composite film pattern;
(e) forming an insulation surface protective film over the first main surface of the semiconductor chip and over each of the bonding pads; and
(f) forming a first opening in the insulation surface protective film over each of the bonding pads,
wherein the bonding pads are arranged in a row in a first direction along an edge part of the chip, and
wherein each bonding pad has a substantially rectangular shape, and has a bonding region to which the bonding wire is coupled and a contact region to which a probe needle contacts.

14. The method of manufacturing a semiconductor integrated circuit device according to claim 13, wherein the composite film pattern contains an aluminum-based wiring in the same layer as that of each bonding pad.

15. The method of manufacturing a semiconductor integrated circuit device according to claim 14, wherein the insulation surface protective film covers an upper surface and side faces of the titanium nitride film.

16. The method of manufacturing a semiconductor integrated circuit device according to claim 13, wherein an exposed part of each bonding pad is covered with an aluminum oxide-based passivation film except for a part of the contact region.

17. The method of manufacturing a semiconductor integrated circuit device according to claim 13, further comprising the step of (g) after the step (f), sealing the first main surface of the semiconductor chip, the bonding pads, and the insulation surface protective film by covering thereon with a halogen-free resin member.

18. The method of manufacturing a semiconductor integrated circuit device according to claim 14, wherein, after the step (d), the titanium nitride film is absent in the vicinity of each bonding pad of the wiring and is present in the other portions, in a second direction orthogonal to the first direction.

* * * * *